(12) United States Patent
Chen et al.

(10) Patent No.: US 11,856,760 B2
(45) Date of Patent: Dec. 26, 2023

(54) BIT CELL WITH BACK-SIDE METAL LINE DEVICE AND METHOD

(71) Applicant: TAIWAN SEMICONDUCTOR MANUFACTURING COMPANY, LTD., Hsinchu (TW)

(72) Inventors: Chien-Ying Chen, Hsinchu (TW); Yao-Jen Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 312 days.

(21) Appl. No.: 17/463,172

(22) Filed: Aug. 31, 2021

(65) Prior Publication Data

US 2023/0067140 A1    Mar. 2, 2023

(51) Int. Cl.
*H10B 20/20* (2023.01)
*G06F 30/392* (2020.01)

(52) U.S. Cl.
CPC ........... *H10B 20/20* (2023.02); *G06F 30/392* (2020.01)

(58) Field of Classification Search
CPC ....... H10B 20/20; H10B 20/25; G06F 30/392; H01L 27/0207; G11C 5/025; G11C 5/10
See application file for complete search history.

(56) References Cited

U.S. PATENT DOCUMENTS

| | | |
|---|---|---|
| 7,260,442 B2 | 8/2007 | Hwang et al. |
| 9,256,709 B2 | 2/2016 | Yu et al. |
| 2014/0040838 A1 | 2/2014 | Liu et al. |
| 2015/0278429 A1 | 10/2015 | Chang |
| 2023/0061343 A1* | 3/2023 | Chen ................... H01L 23/5256 |

* cited by examiner

*Primary Examiner* — Allison Bernstein
(74) *Attorney, Agent, or Firm* — Hauptman Ham, LLP

(57) ABSTRACT

A one-time programmable (OTP) bit cell includes a substrate including a front side and a back side, an active area on the front side, a first read transistor including a first gate and a first portion of the active area intersected by the first gate, a program transistor including a second gate and a second portion of the active area intersected by the second gate, a first electrical connection to the first gate, a second electrical connection to the second gate, and a third electrical connection to the active area. At least one of the first, second, or third electrical connections includes a metal line positioned on the back side.

20 Claims, 26 Drawing Sheets

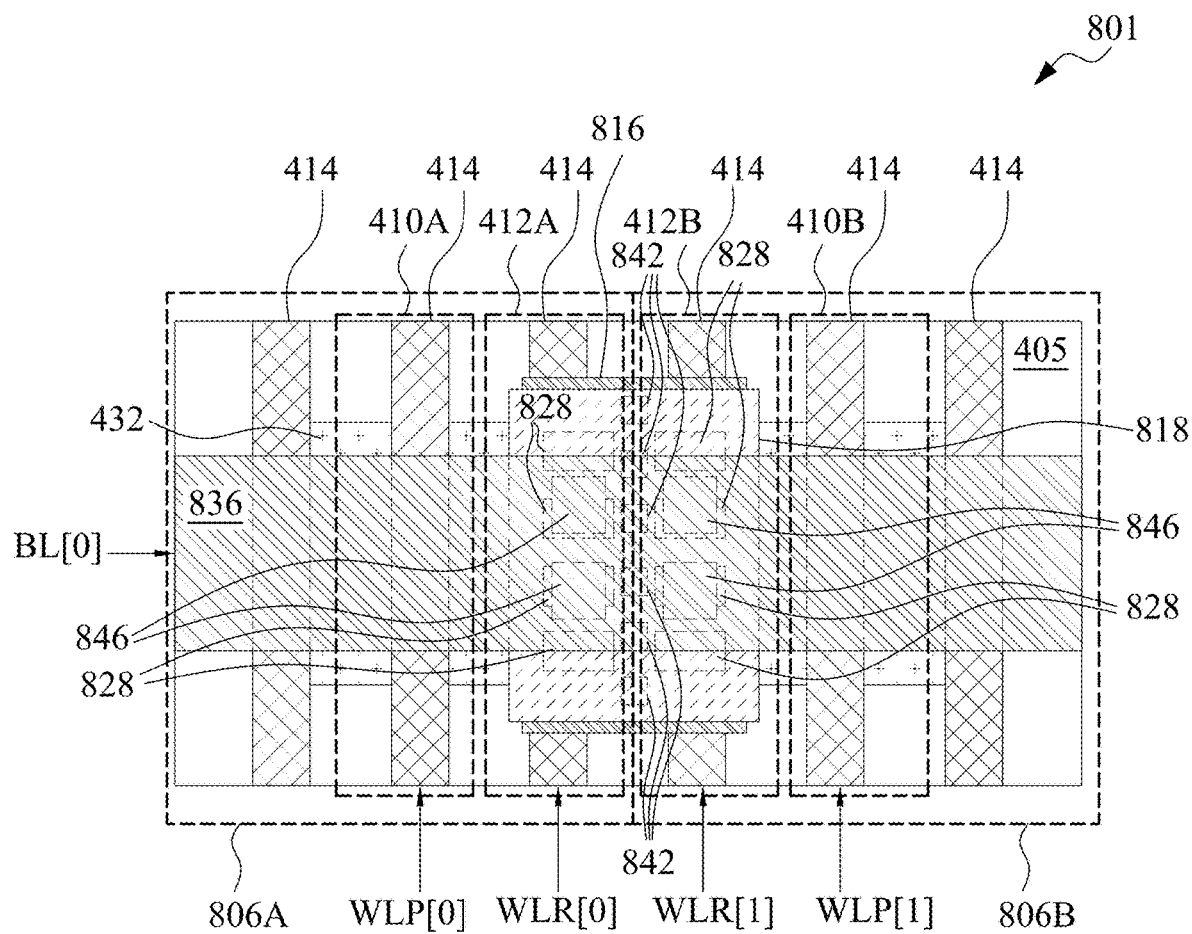
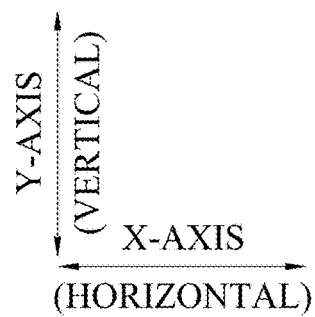
FIG. 8

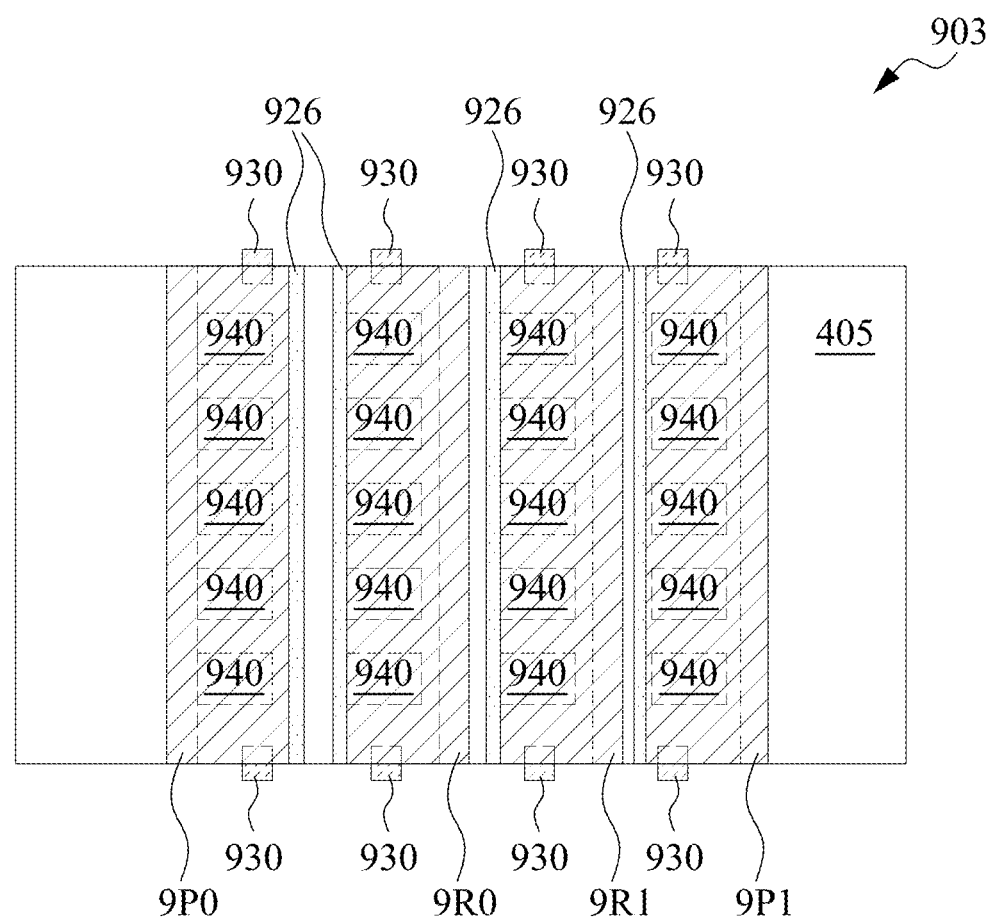
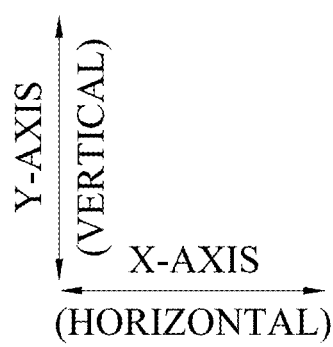
FIG. 9

1900

```
┌─────────────────────────────────────────────────┐
│ FABRICATE PROGRAM AND READ TRANSISTORS ON A     │ ~1910
│ FRONT SIDE OF A SUBSTRATE                       │
└─────────────────────────────────────────────────┘
                        ↓
┌─────────────────────────────────────────────────┐
│ CONSTRUCT A VIA FROM A BACK SIDE OF THE         │ ~1920
│ SUBSTRATE TO THE FRONT SIDE OF THE SUBSTRATE    │
└─────────────────────────────────────────────────┘
                        ↓
┌─────────────────────────────────────────────────┐
│ CONSTRUCT A METAL LINE ON A BACK SIDE OF THE    │ ~1930
│ SUBSTRATE                                       │
└─────────────────────────────────────────────────┘
                        ↓
┌─────────────────────────────────────────────────┐
│ CONSTRUCT A METAL LINE ON A FRONT SIDE OF THE   │ ~1940
│ SUBSTRATE                                       │
└─────────────────────────────────────────────────┘
```

FIG. 19

```
┌─────────────────────────────────────────────────┐
│  OVERLAP AN ACTIVE REGION WITH A PLURALITY OF   │─ 2010
│               GATE REGIONS                       │
└─────────────────────────────────────────────────┘
                         ↓
┌─────────────────────────────────────────────────┐
│  OVERLAP A THROUGH VIA REGION WITH ONE OF THE   │─ 2020
│       GATE REGIONS OR THE ACTIVE REGION          │
└─────────────────────────────────────────────────┘
                         ↓
┌─────────────────────────────────────────────────┐
│   OVERLAP THE THROUGH VIA REGION WITH A METAL    │─ 2030
│      REGION OF A BACK-SIDE METAL LAYER           │
└─────────────────────────────────────────────────┘
                         ↓
┌─────────────────────────────────────────────────┐
│ OVERLAP ONE OF THE GATE REGIONS OR THE ACTIVE    │─ 2040
│ REGION WITH A METAL REGION OF A FRONTSIDE METAL  │
└─────────────────────────────────────────────────┘
                         ↓
┌─────────────────────────────────────────────────┐
│  GENERATE AN IC LAYOUT DIAGRAM INCLUDING THE     │─ 2050
│    METAL REGION OF THE BACK-SIDE METAL LAYER     │
└─────────────────────────────────────────────────┘
                         ↓
┌─────────────────────────────────────────────────┐
│ PERFORM ONE OR MORE MANUFACTURING OPERATIONS     │─ 2060
│       BASED ON THE IC LAYOUT DIAGRAM             │
└─────────────────────────────────────────────────┘
```

BIT CELL WITH BACK-SIDE METAL LINE DEVICE AND METHOD

BACKGROUND

Non-volatile memory (NVM) refers to semiconductor memory that sometimes stores data in floating-gate memory cells consisting of floating-gate metal-oxide-semiconductor field-effect transistors (MOSFETs), including flash memory storage such as NAND flash and solid-state drives (SSD), and read-only memory (ROM) such as erasable programmable ROM (EPROM), electrically erasable programmable ROM (EEPROM), and non-volatile disk storage.

Integrated circuits (ICs) sometimes include one-time-programmable (OTP) memory elements to provide NVM in which data is not lost when the IC is powered off. OTP memory is a type of NVM that permits data to be written once to memory. Once the memory has been programmed, it retains its value upon loss of power.

BRIEF DESCRIPTION OF THE DRAWINGS

Aspects of the present disclosure are best understood from the following detailed description when read with the accompanying FIGS. In accordance with the standard practice in the industry, various features are not drawn to scale. In fact, the dimensions of the various features may be arbitrarily increased or reduced for clarity of discussion.

FIG. 8 is a structure/layout diagram of a 2T OTP bit cell front side, in accordance with some embodiments.

FIG. 9 is a structure/layout diagram of a 2T OTP bit cell back side, in accordance with some embodiments.

FIG. 19 is a flowchart of a method of manufacturing an OTP bit, in accordance with some embodiments.

FIG. 20 is a flowchart of a method of generating an IC layout diagram, in accordance with some embodiments.

DETAILED DESCRIPTION

Figure 1:
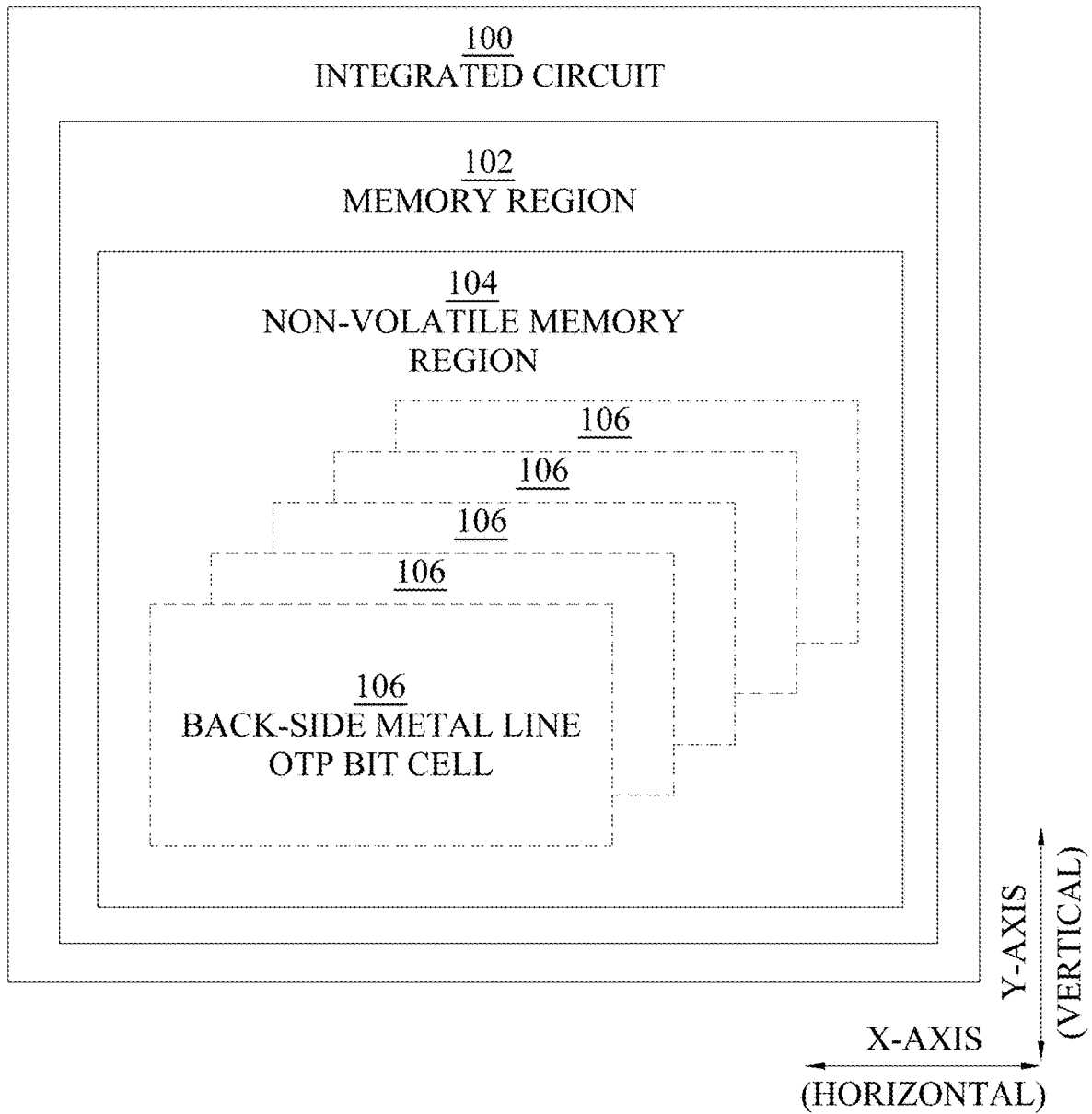
FIG. 1 is a block diagram of an IC including an OTP bit cell, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

In some embodiments, at least one back-side metal line is included in either a bit line electrical connection of an OTP bit cell, e.g., a 2T or 3T bit cell, or an electrical connection to a gate of the OTP bit cell transistors. By distributing metal lines used for the electrical connections among the front and back sides, or entirely on the back side in some embodiments, the collective space available for the metal lines is increased such that the width of a given metal line is capable of being greater than in approaches in which only front-side metal lines are used for bit line and transistor gate electrical connections. The relatively larger metal line widths on the front and/or back sides result in decreased parasitic voltage drops as the metal line resistance is decreased accordingly. In some embodiments, front-side and/or backside metal line widths are up to 3× to 4× greater than those in other such approaches.

By decreasing parasitic voltage drops during programming and read operations, memory cell applied voltages are closer to target values such that the likelihood of functional failure of a given bit cell is decreased compared to other such approaches. This benefit allows bit cell size to remain small while providing adequate spacing between metal lines so as to support the relatively large voltage requirements of the programming operations.

In some embodiments, the increased metal line widths compared to other approaches enables overall electrical connection resistance to be further decreased by increasing the number of vias used to connect the metal lines of adjacent metal layers. In some embodiments, two or more slot vias are arranged in parallel between metal lines of adjacent metal layers compared to a single slot via in other approaches.

FIG. 1 is a block diagram of an IC 100 including an OTP bit cell 106, in accordance with some embodiments. IC 100 includes a memory region 102 including an NVM region 104 that includes one or more OTP bit cells 106, each of which includes at least one back-side metal line. In some embodiments, IC 100, also referred to as an IC device, IC structure, chip, or microchip in some embodiments, is a set of electronic circuits on a substrate (such as a wafer) including one or more semiconductor materials, e.g., silicon. In addition to IC 100, FIG. 1 depicts an X axis and a Y axis.

FIG. 1 is simplified for the purpose of illustration. In various embodiments, IC 100 includes and integrates a large number of metal oxide silicon (MOS) transistors into one or more functional circuits, e.g., a logic device, processing device, system-on-a-chip (SOC), or the like, that are not depicted in FIG. 1.

Memory region 102 includes semiconductor memory configured to store digital data, e.g., a computer memory. Additionally or alternatively, memory region 102 is MOS memory, where data is stored within MOS memory cells on IC 100. In some embodiments, memory region 102 includes random-access memory (RAM), static RAM (SRAM) that use several MOS transistors per memory cell, and/or dynamic RAM (DRAM) that uses a single MOS transistor and capacitor per cell. Additionally or alternatively, memory region 102 includes NVM region 104 that includes NVM devices such as EPROM, EEPROM, and flash memory including floating-gate memory cells. In some embodiments, IC 100 does not include one or both of memory region 102 or NVM region 104.

OTP bit cell 106 is a portion of a memory array that includes at least one OTP bit, the at least one OTP bit including at least one back-side metal line. In some embodiments, an OTP bit cell includes a number of OTP bits based on an IC layout diagram corresponding to the memory array. In some embodiments, OTP bit cell 106 includes two adjacent OTP bits, e.g., two OTP bits that share an electrical connection to a bit line. In some embodiments, OTP bit cell 106 includes four adjacent OTP bits. In some embodiments, OTP bit cell 106 includes a number of bit cells greater than four.

In some embodiments, at least one instance of OTP bit cell 106 includes one or more instances of a 2T OTP bit 206 discussed below with respect to FIG. 2 or one or more instances of a 3T OTP bit 306 discussed below with respect to FIG. 3, and thereby includes at least one back-side metal line. In some embodiments, at least one instance of OTP bit cell 106 is otherwise configured to include at least one back-side metal line.

Figure 4A:
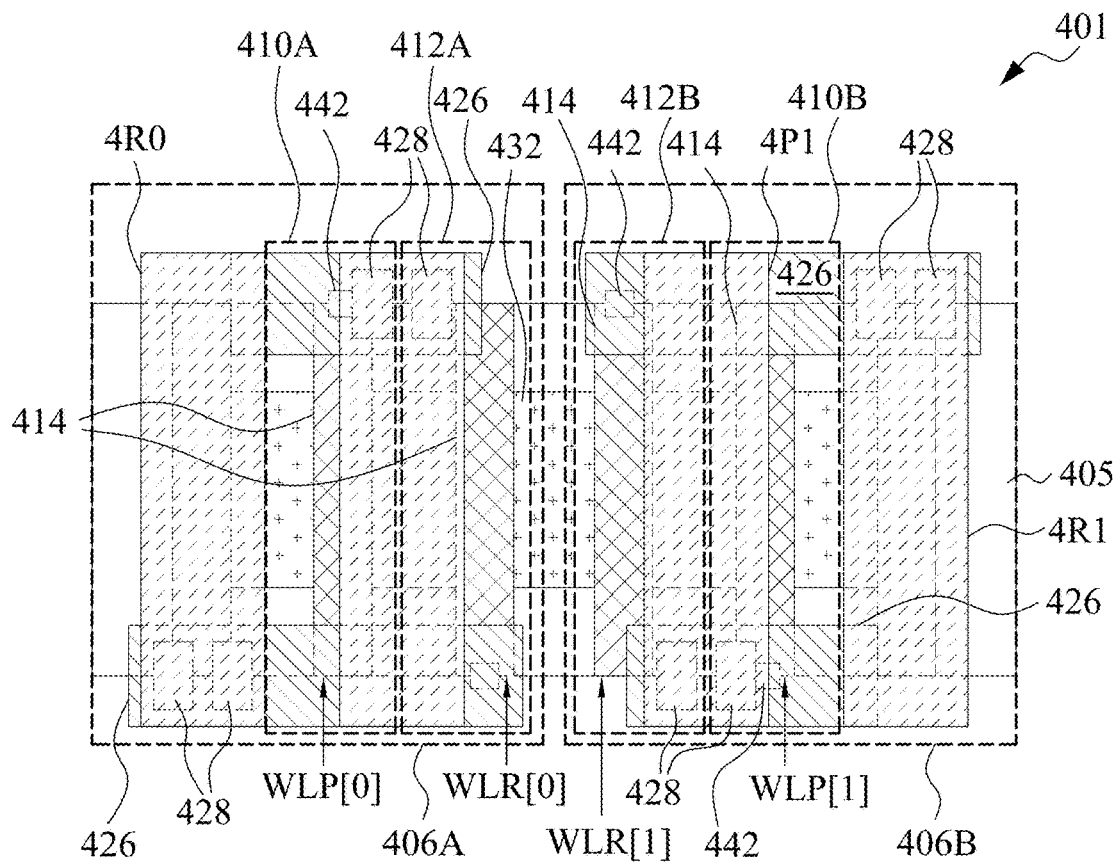
FIG. 4A is a structure/layout diagram of a 2T OTP bit cell front side, in accordance with some embodiments.
Figure 4B:
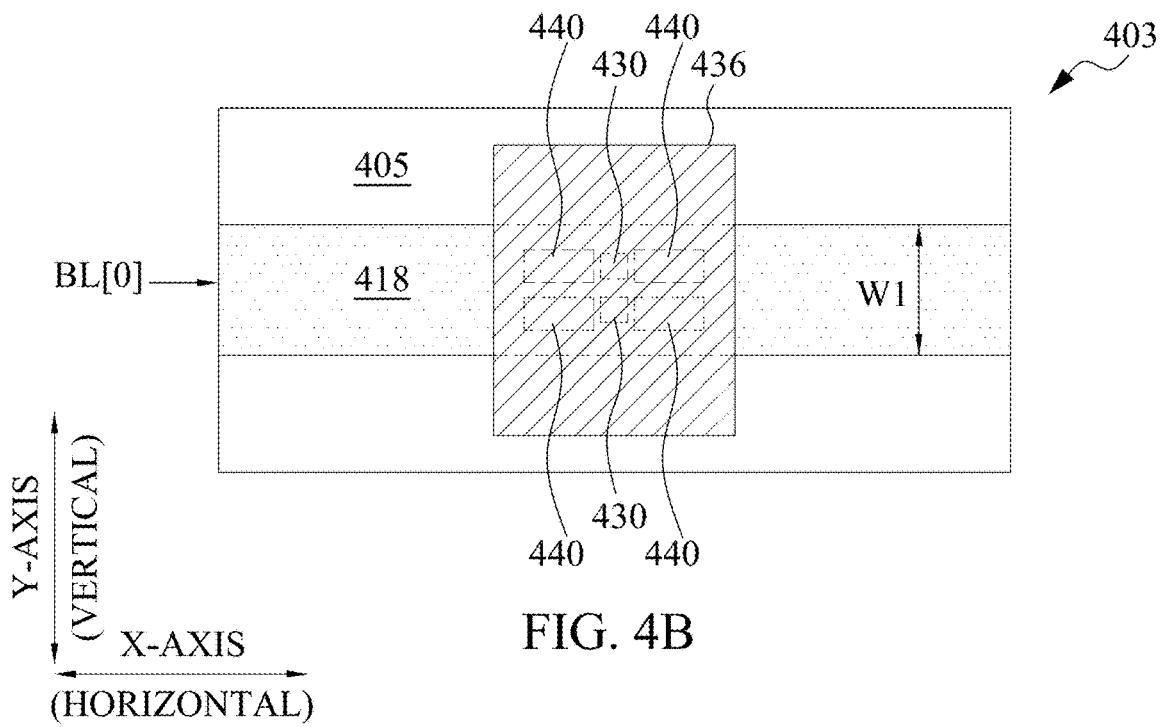
FIG. 4B is a structure/layout diagram of a 2T OTP bit cell back side, in accordance with some embodiments.
Figure 5:
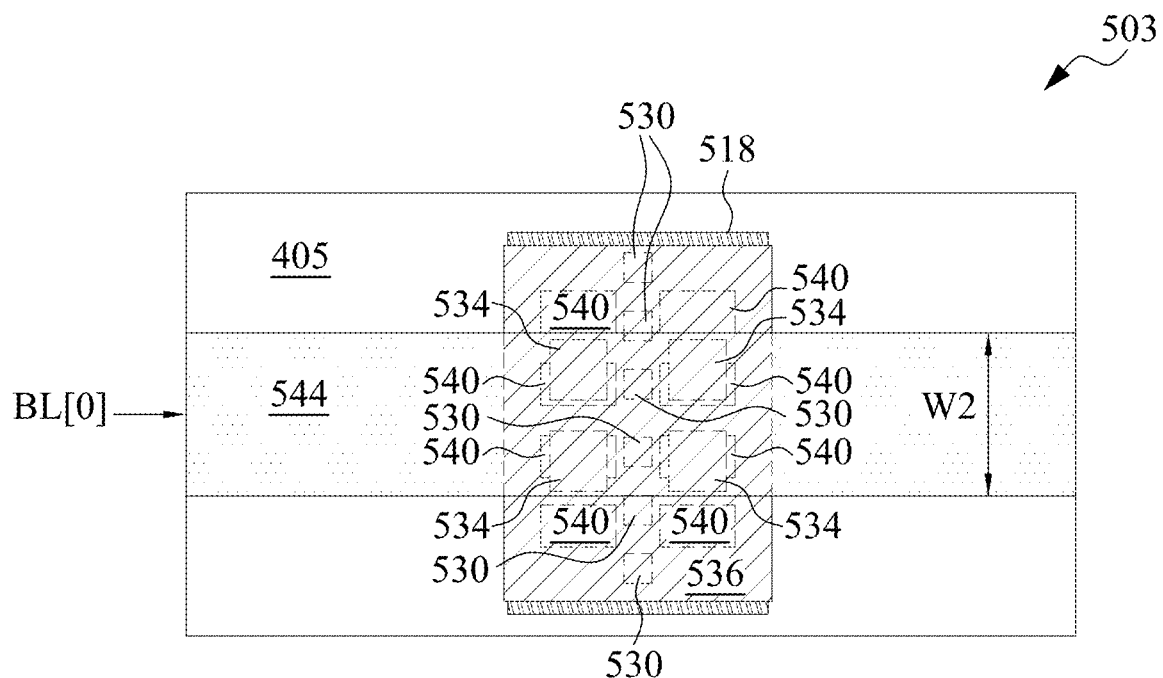
FIG. 5 is a structure/layout diagram of a 2T OTP bit cell back side, in accordance with some embodiments.
Figure 6:
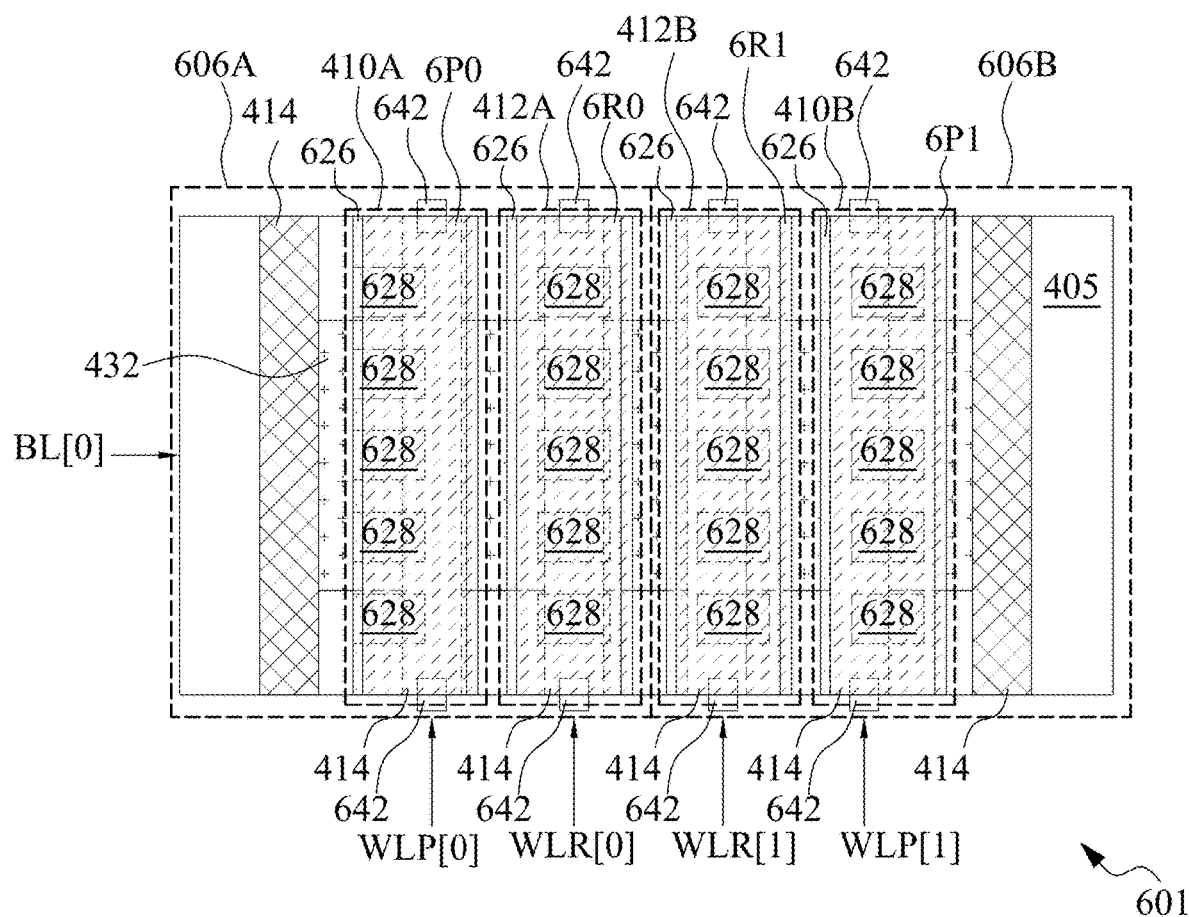
FIG. 6 is a structure/layout diagram of a 2T OTP bit cell front side, in accordance with some embodiments.
Figure 7A:
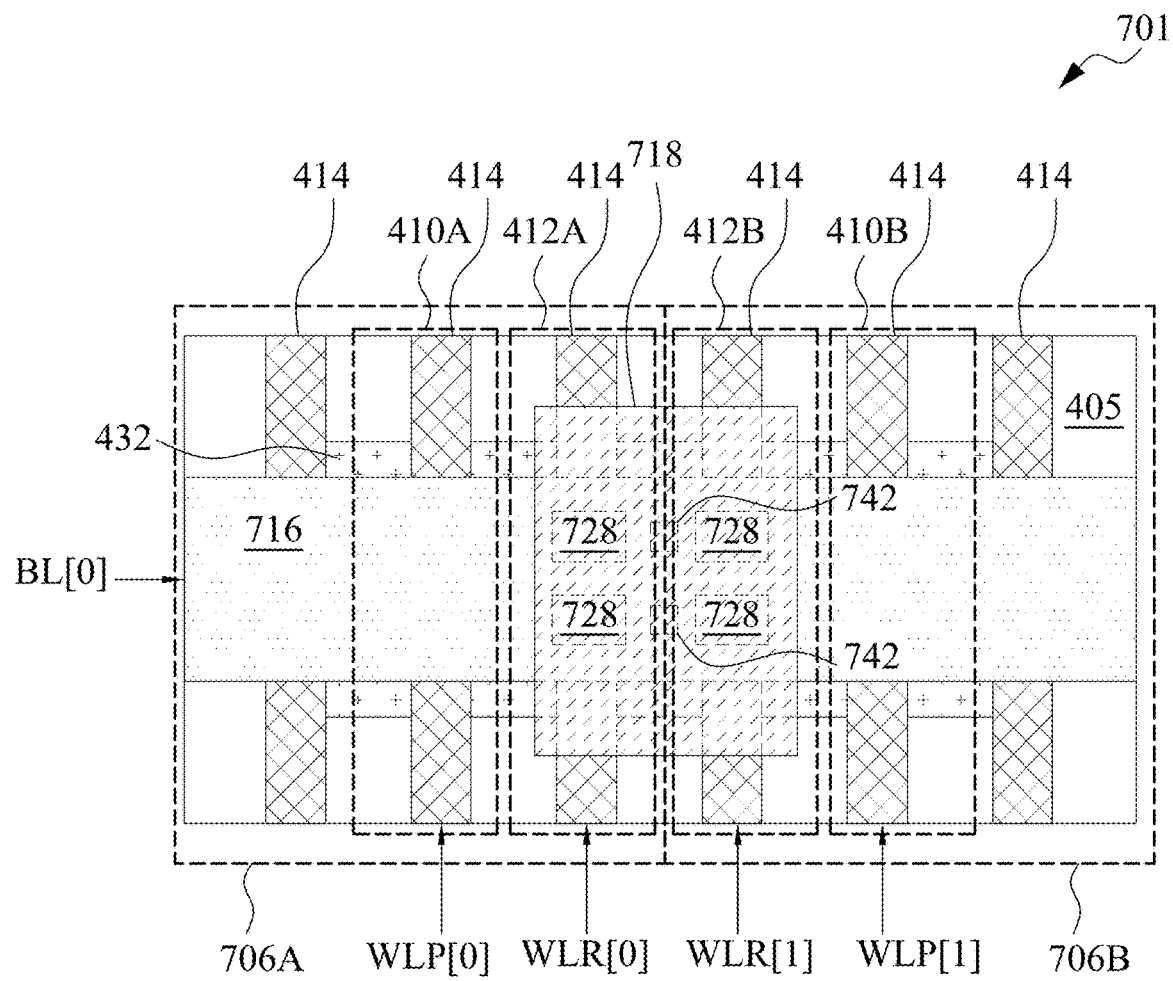
FIG. 7A is a structure/layout diagram of a 2T OTP bit cell front side, in accordance with some embodiments.
Figure 7B:
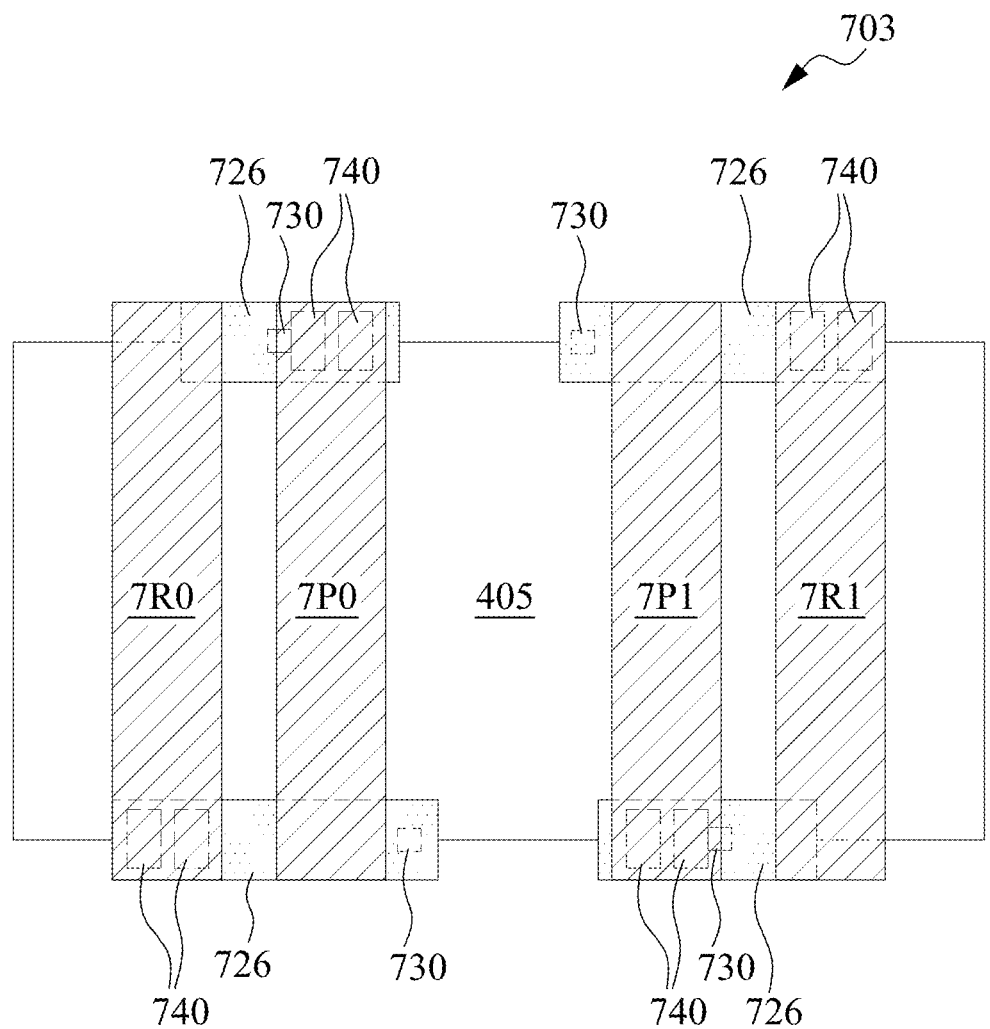
FIG. 7B is a structure/layout diagram of a 2T OTP bit cell back side, in accordance with some embodiments.
Figure 16:
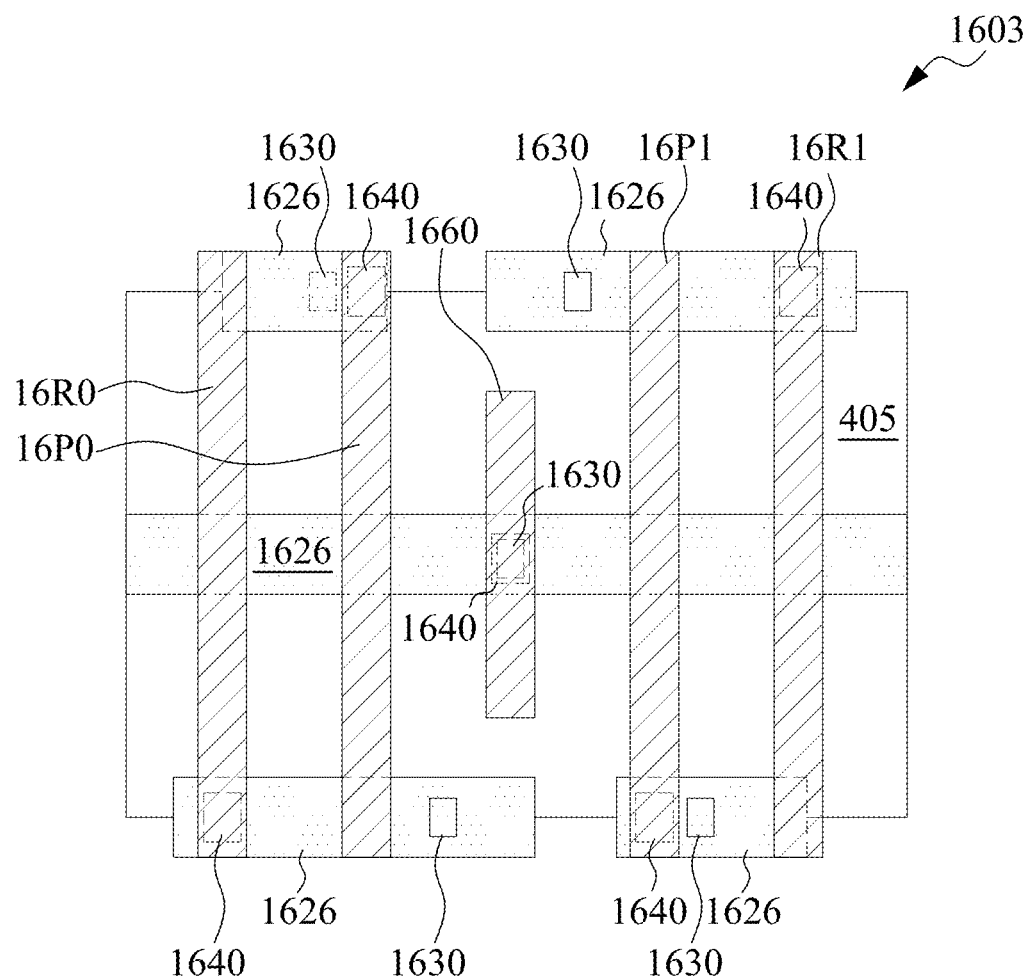
FIG. 16 is a structure/layout diagram of a 2T OTP bit cell back side, in accordance with some embodiments.

Each 2T OTP bit 206 includes at least one back-side metal line either in a bit line electrical connection or in electrical connections to gates of each of the corresponding two transistors, as discussed below with respect to FIGS. 4A-9 and 16. Each of FIGS. 4A-9 and 16 is a plan view representing both an IC structure and an IC layout diagram corresponding to the IC structure. FIGS. 4A and 6 depict embodiments in which the electrical connections to the gates include front-side metal lines; FIGS. 4B and 5 depict embodiments in which the bit line electrical connection includes a back-side metal line; FIGS. 7A and 8 depict embodiments in which the bit line electrical connection includes a front-side metal line; FIGS. 7B and 9 depict embodiments in which the electrical connections to the gates include back-side metal lines; and FIG. 16 depicts an embodiment in which each of the electrical connections to the gates and the bit line electrical connection includes a back-side metal line.

Figure 10A:
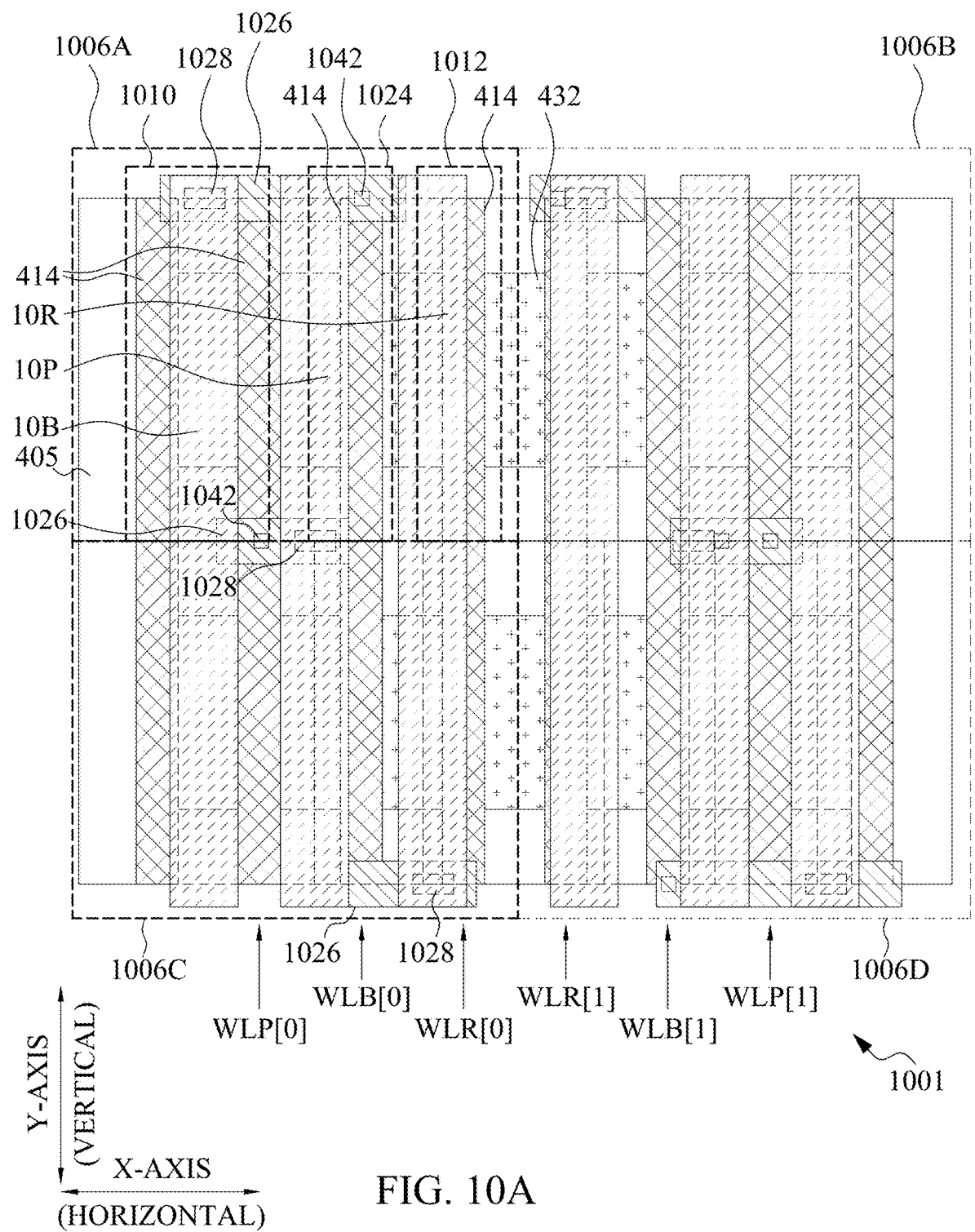
FIG. 10A is a structure/layout diagram of a 3T OTP bit cell front side, in accordance with some embodiments.
Figure 10B:
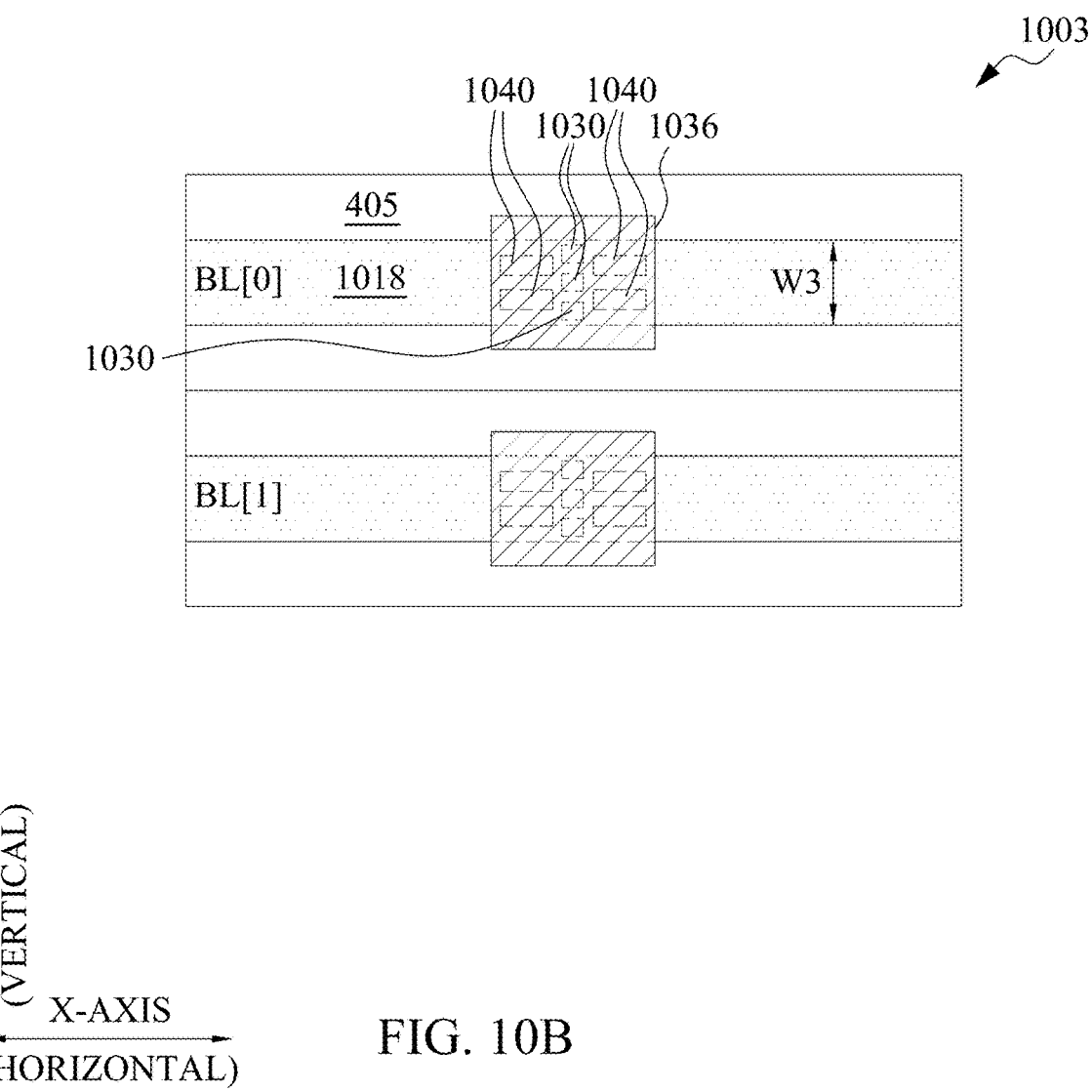
FIG. 10B is a structure/layout diagram of a 3T OTP bit cell back side, in accordance with some embodiments.
Figure 11:
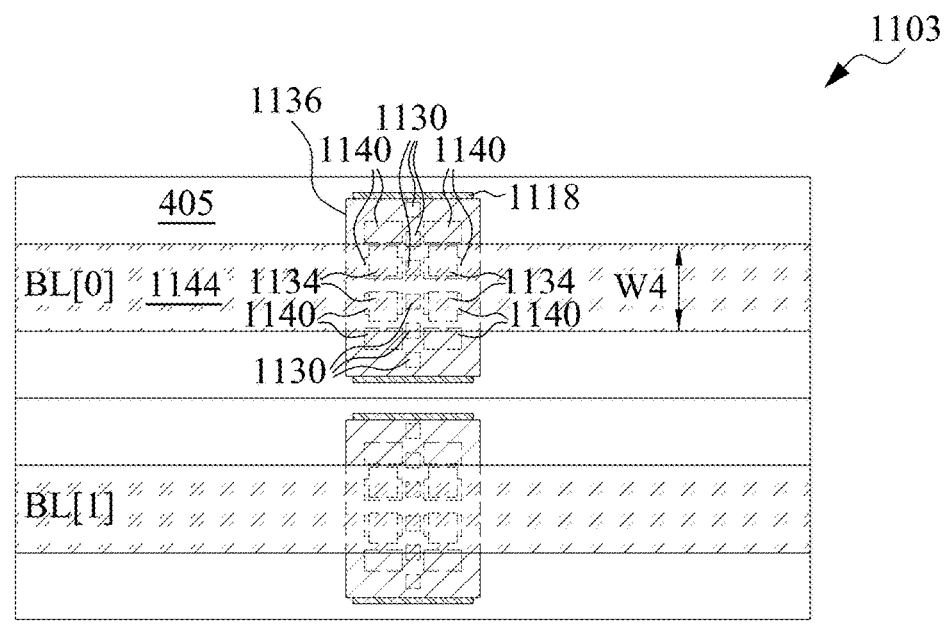
FIG. 11 is a structure/layout diagram of a 3T OTP bit cell back side, in accordance with some embodiments.
Figure 12:
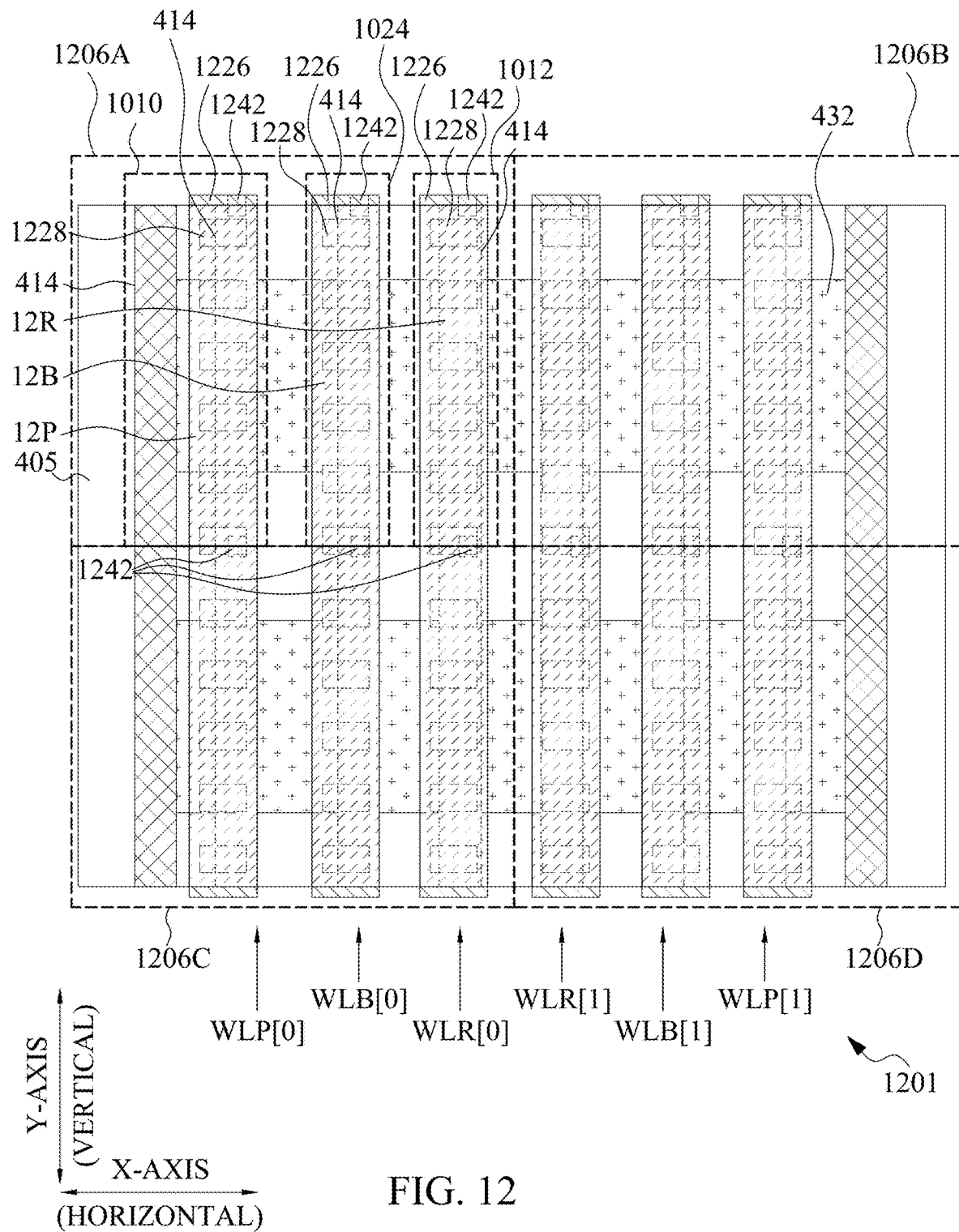
FIG. 12 is a structure/layout diagram of a 3T OTP bit cell front side, in accordance with some embodiments.
Figure 13A:
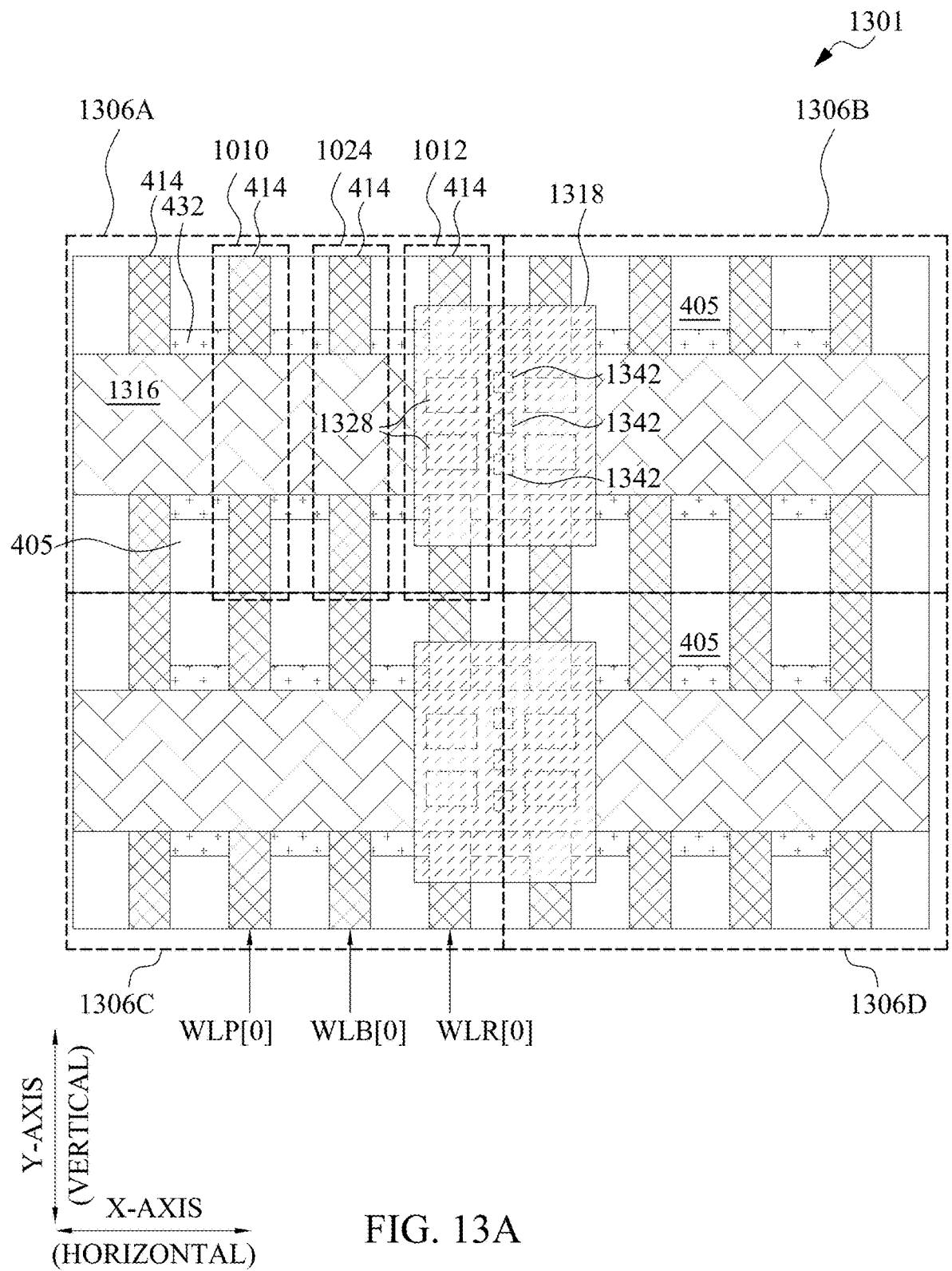
FIG. 13A is a structure/layout diagram of a 3T OTP bit cell front side, in accordance with some embodiments.
Figure 13B:
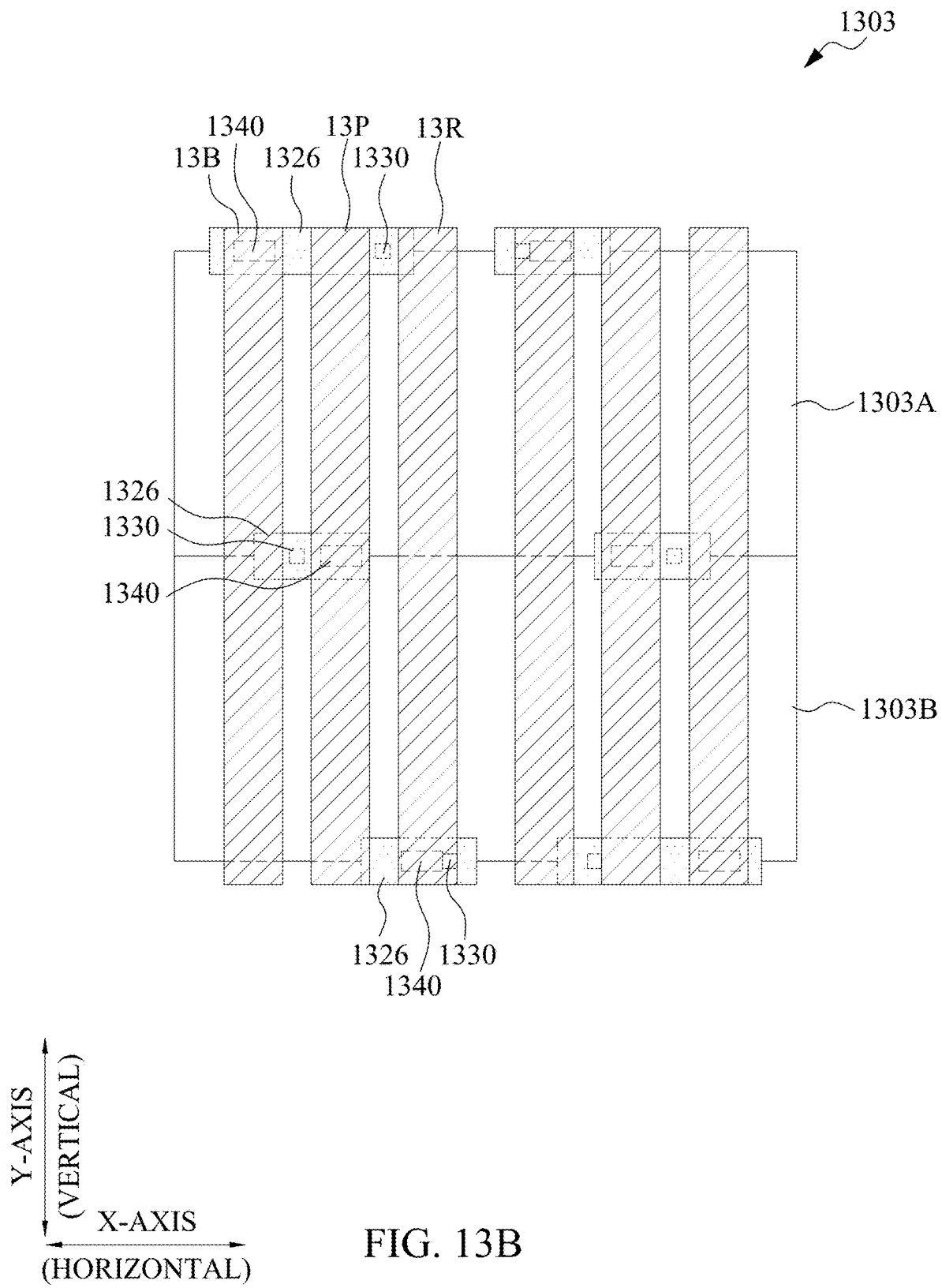
FIG. 13B is a structure/layout diagram of a 3T OTP bit cell back side, in accordance with some embodiments.
Figure 14:
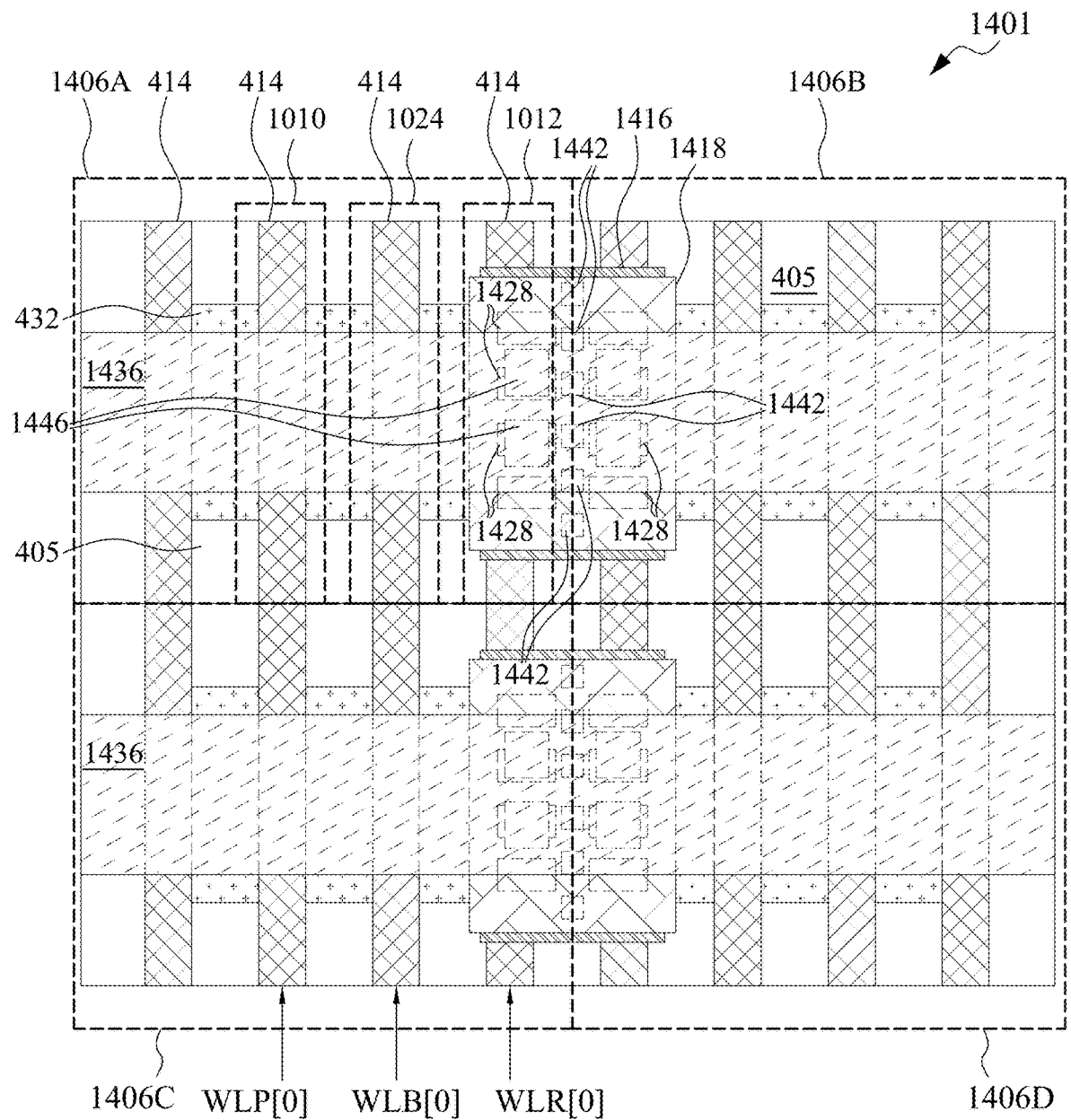
FIG. 14 is a structure/layout diagram of a 3T OTP bit cell front side, in accordance with some embodiments.
Figure 15:
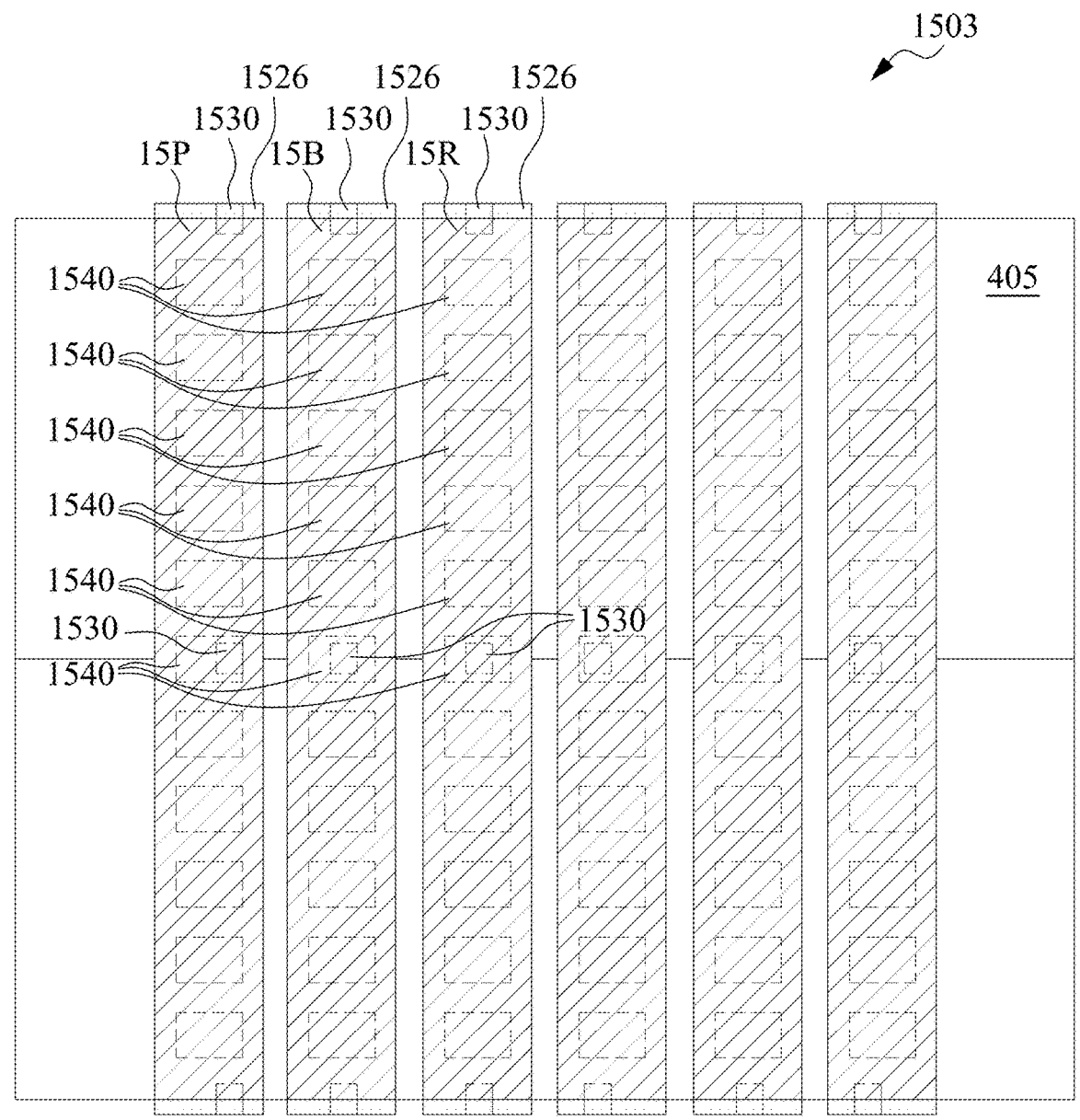
FIG. 15 is a structure/layout diagram of a 3T OTP bit cell backside, in accordance with some embodiments.
Figure 17:
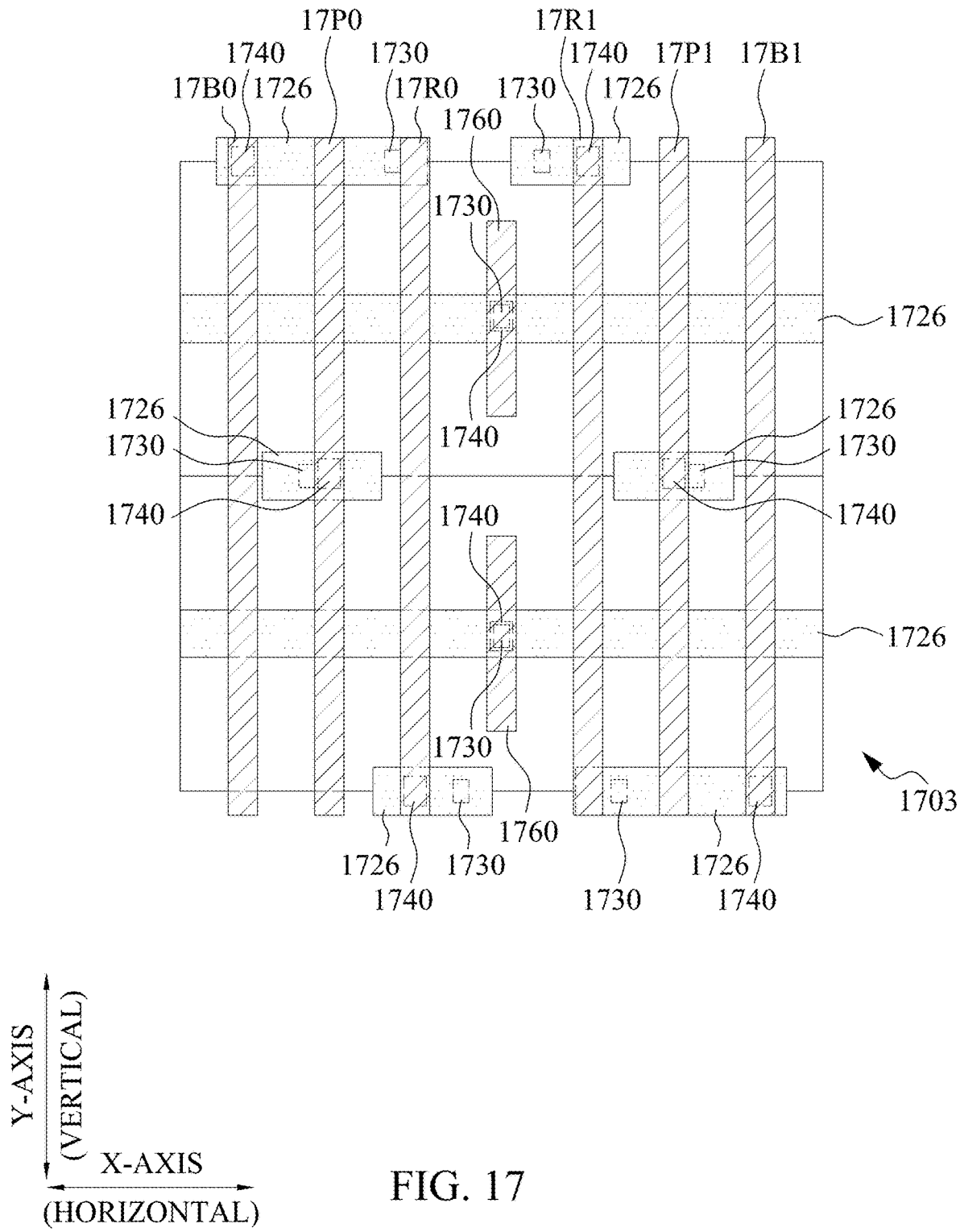
FIG. 17 is a structure/layout diagram of a 3T OTP bit cell back side, in accordance with some embodiments.

Each 3T OTP bit 306 includes at least one back-side metal line either in a bit line electrical connection or in electrical connections to gates of each of the three corresponding transistors, as discussed below with respect to FIGS. 10A-15 and 17. Each of FIGS. 10A-15 and 17 is a plan view representing both an IC structure and an IC layout diagram corresponding to the IC structure. FIGS. 10A and 12 depict embodiments in which the electrical connections to the gates include front-side metal lines; FIGS. 10B and 11 depict embodiments in which the bit line electrical connection includes a back-side metal line; FIGS. 13A and 14 depict embodiments in which the bit line electrical connection includes a front-side metal line; FIGS. 13B and 15 depict embodiments in which the electrical connections to the gates include back-side metal lines; and FIG. 17 depicts an embodiment in which each of the electrical connections to the gates and the bit line electrical connection includes a back-side metal line.

Figure 2:
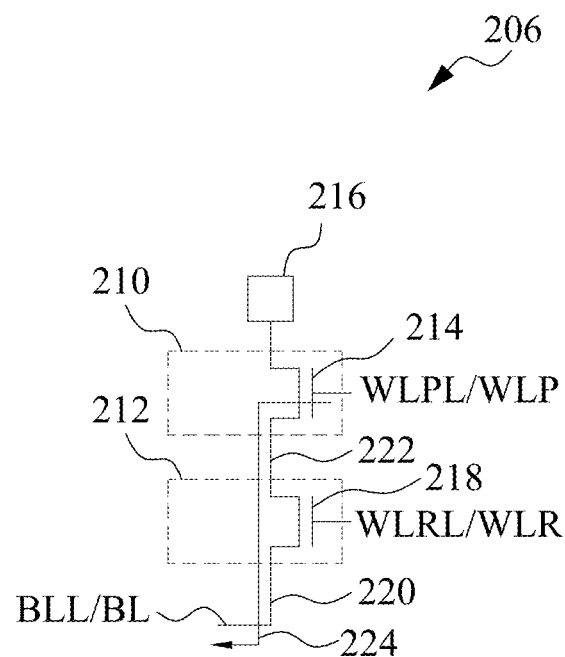
FIG. 2 is a schematic diagram of a two-transistor (2T) OTP bit, in accordance with some embodiments.

FIG. 2 is a schematic diagram of 2T OTP bit 206, in accordance with some embodiments. In some embodiments, one or more instances of 2T OTP bit 206 are included in an OTP bit cell 106 discussed above with respect to FIG. 1.

2T OTP bit 206 includes a program transistor 210 and a read transistor 212. Program transistor 210 includes a gate 214 and a source/drain (S/D) terminal 216, and read transistor 212 includes a gate 218 and a S/D terminal 220. Program transistor 210 and read transistor 212 share a S/D terminal 222.

Program transistor 210 includes an electrical connection WLPL to gate 214 and is thereby configured to receive a programming signal WLP; read transistor 212 includes an electrical connection WLRL to gate 218 and is thereby configured to receive a read signal WLR; and an electrical connection BLL to S/D terminal 220, and is thereby configured to receive a bit line signal BL. S/D terminal 216 is electrically isolated and is thereby configured to have a floating voltage level. At least one of electrical connections WLPL, WLRL, or BLL includes a back-side metal line as discussed below with respect to FIGS. 4A-9 and 16.

In the embodiment depicted in FIG. 2, each of program transistor 110 and read transistor 212 is an NMOS transistor. In some embodiments, one or both of program transistor 110 or read transistor 212 is a PMOS transistor.

Each of electrical connections WLPL, WLRL, and BLL is shared with at least one other instance (not shown in FIG. 2) of 2T OTP bit 206 such that a given instance of 2T OTP bit 206 is configured to receive a unique combination of signals WLP, WLR, and BL. A 2T OTP bit cell, e.g., OTP bit cell 106 discussed above with respect to FIG. 1 in some embodiments, includes at least two instances of 2T OTP bit 206 that share electrical connection BLL. In some embodiments, each of electrical connections WLPL and WLRL corresponds to a column of 2T OTP bits 206, and electrical connection BLL corresponds to a row of 2T OTP bits 206.

In programming and read operations on 2T OTP bit 206, signal WLP is applied to gate 214 through electrical connection WLPL, transistor 212 is turned on responsive to signal WLR applied through electrical connection WLRL, and bit line signal BL having a reference voltage, e.g., ground, is applied to S/D terminal 220 through electrical connection BLL.

Prior to a programming operation, a dielectric layer of gate 214 is configured as an insulator having a high resistance that represents a logically high level, otherwise referred to as a logic 1 in some embodiments. In a programming operation, signal WLP has a programming voltage level such that a difference between the programming voltage level and the reference voltage level produces an electric field across a dielectric layer of gate 214 sufficiently large to sustainably alter the dielectric material such that a resultant lowered resistance represents a logically low level, otherwise referred to as a logic 0 in some embodiments.

In a read operation, signal WLP has a read voltage level such that a difference between the read voltage level and the reference voltage level produces an electric field that is sufficiently small to avoid sustainably altering the dielectric material of gate 214 and sufficiently large to generate a current 224 flowing through electrical connections WLPL and BLL and having a magnitude capable of being sensed by a sense amplifier (not shown) and thereby used to determine a programmed status of 2T OTP bit 206.

In various embodiments, one or both of the programming or read voltage levels is either positive relative to the reference voltage level or negative relative to the reference voltage level.

Figure 3:
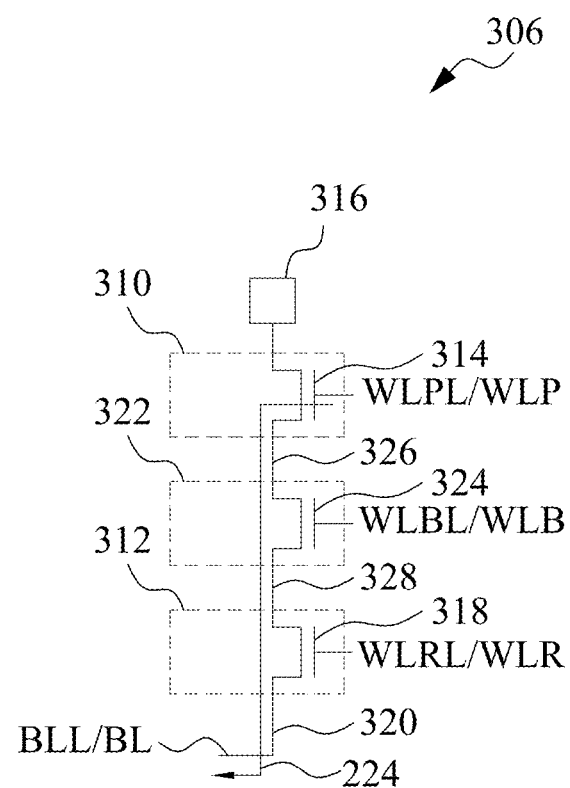
FIG. 3 is a schematic diagram of a three-transistor (3T) OTP bit, in accordance with some embodiments.

FIG. 3 is a schematic diagram of 3T OTP bit 306, in accordance with some embodiments. In some embodiments, one or more instances of 3T OTP bit 306 are included in an OTP bit cell 106 discussed above with respect to FIG. 1.

3T OTP bit 306 includes a program transistor 310 and a read transistor 312. Program transistor 310 includes a gate 314 and a S/D terminal 316 configured in the manner discussed above with respect to program transistor 210 depicted in FIG. 2. Read transistor 312 includes a gate 318 and a S/D terminal 320 configured in the manner discussed above with respect to read transistor 212 depicted in FIG. 2.

3T OTP bit 306 also includes a read transistor 322 including a gate 324. Program transistor 310 and read transistor 322 share a S/D terminal 326, and read transistors 322 and 312 share a S/D terminal 328. Read transistor 322 includes an electrical connection WLBL to gate 324 and is thereby configured to receive a read signal WLB. At least one of electrical connections WLPL, WLRL, WLBL, or BLL includes a back-side metal line as discussed below with respect to FIGS. 10A-15 and 17.

Electrical connection WLBL is shared with at least one other instance (not shown in FIG. 3) of 3T OTP bit 306 such that a given instance of 3T OTP bit 306 is configured to receive a unique combination of signals WLP, WLR, WLB, and BL. A 3T OTP bit cell, e.g., OTP bit cell 106 discussed above with respect to FIG. 1 in some embodiments, includes at least two instances of 3T OTP bit 306 that share electrical connection BLL. In some embodiments, each of electrical connections WLPL, WLRL, and WLBL corresponds to a column of 3T OTP bits 306, and electrical connection BLL corresponds to a row of 3T OTP bits 306.

Programming and read operations on 3T OTP bit 306 are performed as discussed above with respect to FIG. 2 and include the addition of transistor 322 being turned on responsive to signal WLB applied through electrical connection WLBL such that current 224 flows through electrical connections WLPL and BLL.

In some embodiments, electrical connections WLPL, WLRL, and WLBL, also referred to as program wordline WLPL, read wordline WLRL, and read wordline WLBL in some embodiments, of 2T OTP bit 206 or 3T OTP bit 306 are located on a front side of a substrate in the form of front-side metal lines, and electrical connection BLL, also referred to as bit line BLL in some embodiments, is at least partially located on the substrate back side in the form of back-side metal line(s). In some embodiments, program wordline WLPL and read wordlines WLRL and WLBL are at least partially located on the substrate back side in the form of back-side metal line(s), and bit line BLL is located on the substrate front side in the form of front-side metal line(s). In some embodiments, each of program wordline WLPL, read wordlines WLRL and WLBL, and bit line BLL is at least partially located on the substrate back side implemented in back-side metal line(s). As discussed below, functionally equivalent and structurally different front-side metal line configurations are capable of being combined with functionally equivalent and structurally different back-side metal line configurations for each of a 2T OTP bit cell including 2T OTP bit 206 and a 3T OTP bit cell including 3T OTP bit 306.

FIGS. 4A, 6, 7A, and 8 are structure/layout diagrams of 2T OTP bit cell front sides, in accordance with some embodiments. FIGS. 4B, 5, 7B, and 9 are structure/layout diagrams of 2T OTP bit cell back sides, in accordance with some embodiments. FIGS. 10A, 12, 13A, and 14 are structure/layout diagrams of 3T OTP bit cell front sides, in accordance with some embodiments. FIGS. 10B, 11, 13B, and 15 are structure/layout diagrams of 3T OTP bit cell back sides, in accordance with some embodiments.

In some embodiments, Table 1 lists possible front-side and back-side permutations for a 2T OTP bit cell. In some embodiments, front side 401 of FIG. 4A is configured to be combined with back side 403 of FIG. 4B or back side 503 of FIG. 5. In some embodiments, front side 601 of FIG. 6 is configured to be combined with back side 403 of FIG. 4B or back side 503 of FIG. 5. In some embodiments, front side 701 of FIG. 7A is configured to be combined with back side 703 of FIG. 7B or back side 903 of FIG. 9. In some embodiments, front side 801 of FIG. 8 is configured to be combined with back side 703 of FIG. 7B or back side 903 of FIG. 9.

TABLE 1

2T OTP Bit Cell Combinations

| | 2T | Front side | | | |
|---|---|---|---|---|---|
| | | FIG. 4A | FIG. 6 | FIG. 7A | FIG. 8 |
| Back side | FIG. 7B | X | X | ✓ | ✓ |
| | FIG. 9 | X | X | ✓ | ✓ |
| | FIG. 4B | ✓ | ✓ | X | X |
| | FIG. 5 | ✓ | ✓ | X | X |

In some embodiments, Table 2 lists possible front-side and back-side permutations for a 3T OTP bit cell. In some embodiments, front side 1001 of FIG. 10A is configured to be combined with back side 1003 of FIG. 10B or back side 1103 of FIG. 11. In some embodiments, front side 1201 of FIG. 12 is configured to be combined with back side 1003 of FIG. 10B or back side 1103 of FIG. 11. In some embodiments, front side 1301 of FIG. 13A is configured to be combined with back side 1303 of FIG. 13B or back side 1503 of FIG. 15. In some embodiments, front side 1401 of FIG. 14 is configured to be combined with back side 1303 of FIG. 13B or back side 1503 of FIG. 15.

TABLE 2

3T OTP Bit Cells

| | 3T | Front side | | | |
|---|---|---|---|---|---|
| | | FIG. 10A | FIG. 12 | FIG. 13A | FIG. 14 |
| Back side | FIG. 13B | X | X | ✓ | ✓ |
| | FIG. 15 | X | X | ✓ | ✓ |
| | FIG. 10B | ✓ | ✓ | X | X |
| | FIG. 11 | ✓ | ✓ | X | X |

Figure 18A:
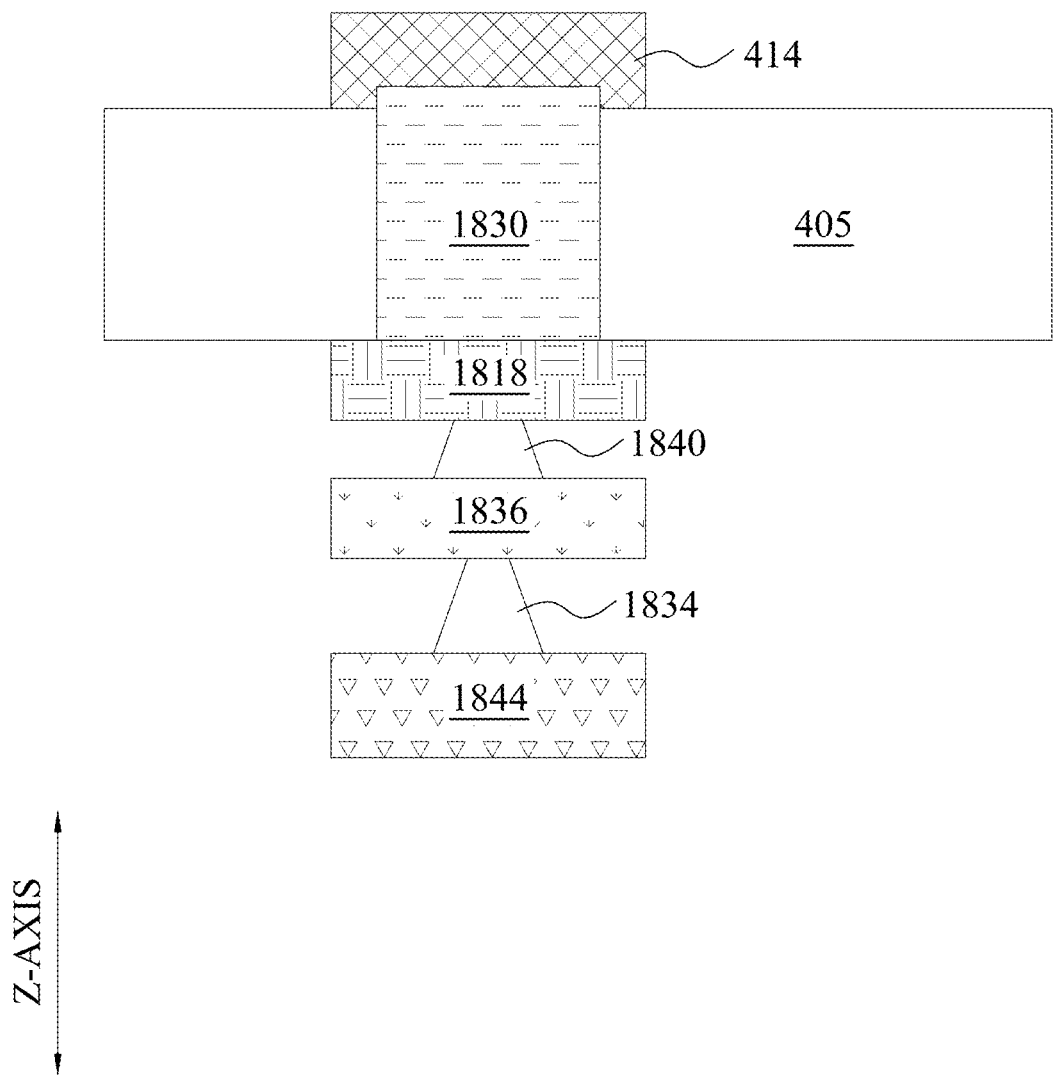
FIGS. 18A and 18B are diagrams of an IC structure, in accordance with some embodiments.
Figure 18B:
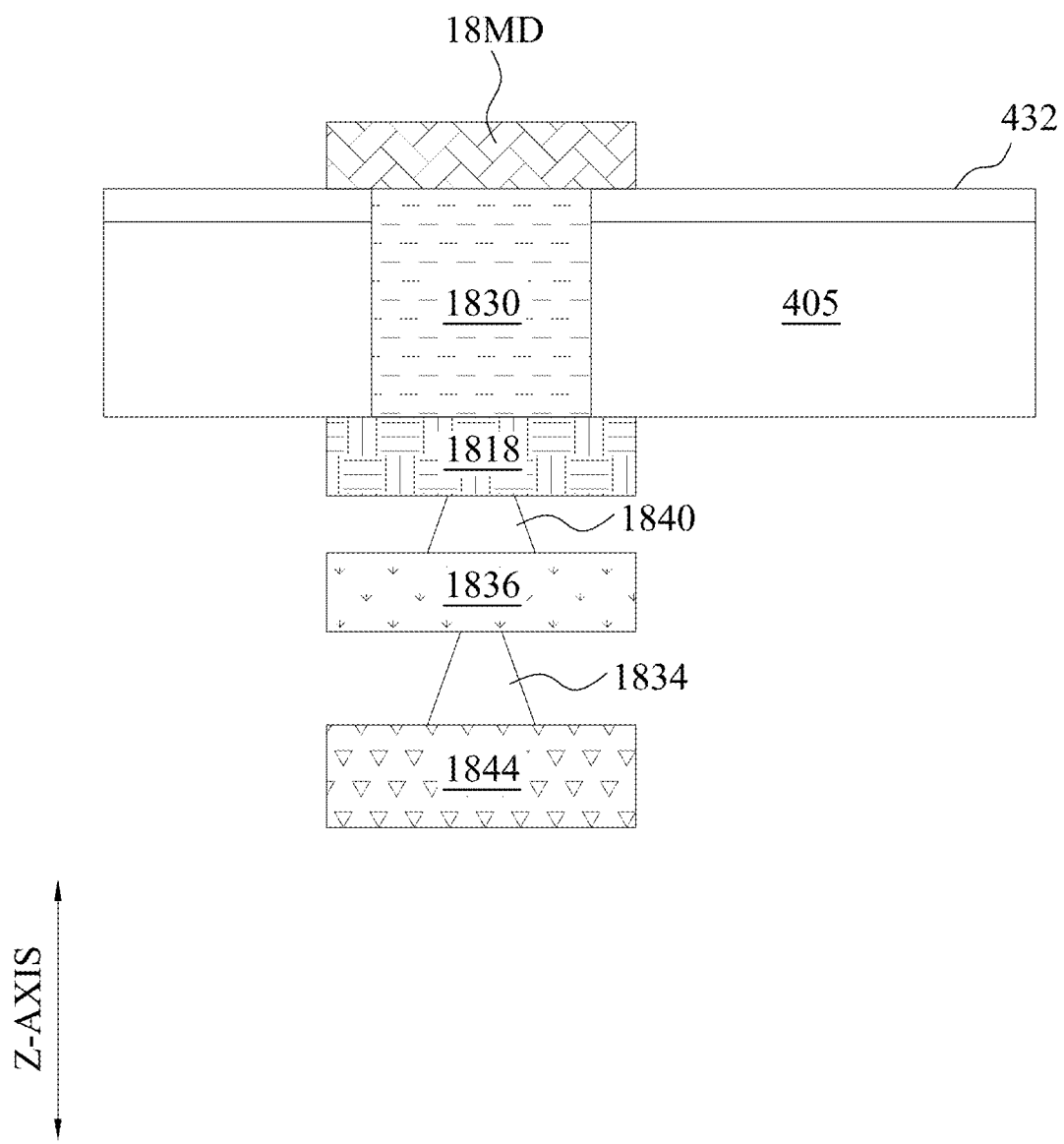

Each of FIGS. 4A-18B discussed below is a structure/layout diagram in which the reference designators represent both IC structure features and IC layout features used to at least partially define the corresponding IC structure features in a manufacturing process, e.g., a method 1900 discussed below with respect to FIG. 19 and/or an IC manufacturing flow associated with an IC manufacturing system 2200 discussed below with respect to FIG. 22. In some embodiments, one or more of FIGS. 4A-18B is some or all of an IC layout diagram generated by executing some or all of the operations of a method 2000 discussed below with respect to FIG. 20. Accordingly, each of FIGS. 4A-17 represents both an IC layout diagram and a plan view of a corresponding structure as viewed from the corresponding front-side or back-side perspective, and each of FIGS. 18A and 18B represents both an IC layout diagram and a cross-sectional view of a corresponding portion of a structure.

In FIGS. 4A-18B, an active region, e.g., an active region 432, corresponds to both a region in the IC layout diagram and an active area on the front side of the substrate and included, at least in part, in the corresponding IC device. The active region is included in the manufacturing process as part of defining the active area, also referred to as an oxide diffusion or definition (OD), in the semiconductor substrate in which one or more IC device features, e.g., a S/D region, is formed. In various embodiments, an active area defined by an active region is an n-type or p-type active area of a planar transistor or a fin, field-effect transistor (FinFET).

A gate, e.g., a gate 414, corresponds to both a gate region in the IC layout diagram and a gate structure in the corresponding IC device. The gate region is included in the manufacturing process as part of defining the gate structure on the front side of the substrate and included, at least in part, in the corresponding IC device. The gate structure includes a gate electrode including at least one conductive material and overlying at least one dielectric layer including at least one dielectric material. Conductive materials include one or more of polysilicon, copper (Cu), aluminum (Al), tungsten (W), cobalt (Co), ruthenium (Ru), or one or more other metals, and/or one or more other suitable materials. Dielectric materials include one or more of silicon dioxide ($SiO_2$), silicon nitride ($Si_3N_4$), and/or a high-k dielectric material, e.g., a dielectric material having a k value higher than 3.8 or 7.0 such as aluminum oxide ($Al_2O_3$), hafnium oxide ($HfO_2$), tantalum pentoxide ($Ta_2O_5$), or titanium oxide ($TiO_2$), or another suitable material.

In some cases, a gate intersects an active region at a location that corresponds to a transistor, e.g., a program transistor 210 or 310. In some cases, a gate intersects an active region at a location that does not correspond to a transistor, and the corresponding gate structure, or portion thereof, is referred to as a dummy gate structure in some embodiments.

A metal line, e.g., a metal line 426, corresponds to both a metal region in the IC layout diagram and a metal line in the corresponding IC device. The metal region is included in the manufacturing process as part of defining one or more metal line segments of a front-side or back-side metal layer. In various embodiments, a metal line corresponds to a first front-side or back-side metal layer, a second front-side or back-side metal layer, a third front-side or back-side metal layer, or a higher front-side or back-side metal layer. In some embodiments, first, second, third, and higher metal layers are referred to as metal zero, metal one, metal two, and corresponding higher metal numbers, respectively.

A via, e.g., a via 428, corresponds to both a via region in the IC layout diagram and a via structure in the corresponding IC device. The via region is included in the manufacturing process as part of defining one or more metal via structures configured to electrically connect overlapping metal line segments of adjacent front-side or back-side metal layers, or electrically connect a front-side feature, e.g., an active area or gate electrode of a gate structure, to an overlying metal line of the first front-side metal layer. In various embodiments, a via overlies and thereby corresponds to one or more of a first front-side or back-side metal layer, a second front-side or back-side metal layer, or a higher front-side or back-side metal layer in the IC device. In some embodiments, first, second, and higher vias are referred to as metal zero vias, metal one vias, and corresponding higher vias, respectively. In some embodiments, a via having a rectangular shape in plan view is referred to as a slot via.

A through via, e.g., a through via 430, corresponds to both a through via region in the IC layout diagram and a through via structure in the corresponding IC device. The through via region is included in the manufacturing process as part of defining the through via structure extending from a front-side feature, e.g., an active area or gate electrode of a gate structure, through the substrate to a back-side metal line in the IC device. In some embodiments, a through via is referred to as a through-silicon via (TSV).

Non-limiting examples of spatial relationships between active regions, gates, metal lines, vias, and through vias, e.g., along a Z axis, are discussed below with respect to the cross-sectional depictions of FIGS. 18A and 18B.

Each of FIGS. 4A-18B is simplified for the purpose of illustration. In various embodiments, one or more of FIG. 4A-18B includes one or more features in addition to those depicted in FIGS. 4A-18B. In some embodiments, one or more of FIGS. 4A-18A includes one or more metal-like defined (MD) regions e.g., an MD segment 18MD depicted in FIG. 18B, overlapping a S/D region of an active area and configured to provide an electrical connection to the S/D region. In some embodiments, an MD region extends beyond an active area along the Y axis in one or both of the positive or negative Y direction and is thereby configured to provide an electrical connection to the S/D region at one or more locations outside of the active area.

An MD region, e.g., MD segment 18MD, corresponds to both an MD region in the IC layout diagram and an MD structure in the corresponding IC device. The MD region is included in the manufacturing process as part of defining an MD segment, also referred to as a conductive segment or MD conductive line or trace, in and/or on a semiconductor substrate, e.g., a substrate 405 discussed below. In some embodiments, an MD segment includes a portion of at least one metal layer, e.g., a contact layer, overlying and contacting the substrate and having a thickness sufficiently small to enable formation of an insulation layer between the MD segment and an overlying metal layer, e.g., a first metal layer. In some embodiments, an MD segment includes an epitaxial layer having a doping level, e.g., based on an implantation process, sufficient to cause the segment to have the low resistance level.

In various embodiments, one or more of FIGS. 4A-18B depicts only a portion of a feature, e.g., a gate or metal line, corresponding to a cell boundary (not labeled), and the feature extends beyond the cell boundary. In some embodiments, a gate, e.g., gate 414, depicted as overlapping a portion of a via, e.g., a via 442, extends along the Y axis in one or both of the positive or negative Y direction, e.g., along a column of OTP bit cells, whereby the gate overlaps an entirety of the via. In some embodiments, a metal line, e.g., metal line 426, extends along one of the X or Y axis in one or both of the positive or negative X or Y direction whereby the metal line overlaps one or more OTP bit cells, e.g., a row of OTP bit cells, in addition to the depicted OTP bit cell.

FIG. 4A is a structure/layout diagram of a 2T OTP bit cell front side 401, in accordance with some embodiments. In some embodiments, front side 401 is configured to be combined with a back side 403 (FIG. 4B) or a back side 503 (FIG. 5) to create a 2T OTP bit cell including 2T OTP bits 206.

Front side 401 includes 2T OTP bits 406A and 406B, each of which corresponds to 2T OTP bit 206. 2T OTP bit 406A includes a program transistor 410A and a read transistor 412A corresponding to respective program transistor 210 and read transistor 212, and 2T OTP bit 406B includes a program transistor 410B and a read transistor 412B corresponding to respective program transistor 210 and read transistor 212.

A substrate 405 includes an active region 432 that extends in a first direction (along the X axis). Gates 414 extend in a second direction (along the Y axis) and intersect and overlie active region 432 at locations corresponding to program transistors 410A and 410B and read transistors 412A and 412B; two additional gates 414 are dummy gates.

A portion of active region 432 (not labeled) between read transistors 412A and 412B corresponds to S/D terminal 220. Each portion of active region 432 (not labeled) between program and read transistors 410A and 412A and between program and read transistors 410B and 412B corresponds to shared S/D terminal 222. Each portion of active region 432 (not labeled) between program transistor 410A and the adjacent dummy gate 414 and between program transistor 410B and the adjacent dummy gate 414 corresponds to S/D terminal 216.

A via 442 overlaps and is electrically connected to gate 414 of program transistor 410A; a metal line 426 extends along the X axis in a first front-side metal layer and overlaps and is electrically connected to the via 442; two vias 428 overlap and are electrically connected to the metal line 426; and a metal line 4P0 extends along the Y axis in a second front-side metal layer and overlaps and is electrically connected to the vias 428. The via 442, metal line 426, vias 428, and metal line 4P0 are thereby configured as an instance of electrical connection WLPL configured to receive a signal WLP[0], an instance of signal WLP.

A via 442 overlaps and is electrically connected to gate 414 of read transistor 412A; a metal line 426 extends along the X axis and overlaps and is electrically connected to the via 442; two vias 428 overlap and are electrically connected to the metal line 426; and a metal line 4R0 extends along the Y axis in the second front-side metal layer and overlaps and is electrically connected to the vias 428. The via 442, metal line 426, vias 428, and metal line 4R0 are thereby configured as an instance of electrical connection WLRL configured to receive a signal WLR[0], an instance of signal WLR.

A via 442 overlaps and is electrically connected to gate 414 of read transistor 412B; a metal line 426 extends along the X axis and overlaps and is electrically connected to the via 442; two vias 428 overlap and are electrically connected to the metal line 426; and a metal line 4R1 extends along the Y axis in the second front-side metal layer and overlaps and is electrically connected to the vias 428. The via 442, metal line 426, vias 428, and metal line 4R1 are thereby configured as an instance of electrical connection WLRL configured to receive a signal WLR[1], an instance of signal WLR.

A via 442 overlaps and is electrically connected to gate 414 of program transistor 410B; a metal line 426 extends along the X axis and overlaps and is electrically connected to the via 442; two vias 428 overlap and are electrically connected to the metal line 426; and a metal line 4P1 extends along the Y axis in the second front-side metal layer and overlaps and is electrically connected to the vias 428. The via 442, metal line 426, vias 428, and metal line 4P1 are thereby configured as an instance of electrical connection WLPL configured to receive a signal WLP[1], an instance of signal WLP.

In some embodiments, during OTP bit cell programming and reading operations, signals WLP[0] and WLR[0] are received at gates 414 of 2T OTP bit 406A, signals WLP[1] and WLR[1] are received at gates 414 of 2T OTP bit 406B, and bit line signal BL[0] is received at S/D terminal 220 through electrical connection BLL configured based on a back side, e.g., back side 403 or 503.

FIG. 4B is a layout diagram of 2T OTP bit cell back side 403, in accordance with some embodiments. In some embodiments, back side 403 is configured to be combined with front side 401 (FIG. 4A) or a front side 601 (FIG. 6) to create a 2T OTP bit cell including 2T OTP bits 206.

Back side 403 includes substrate 405 and two through vias 430 that extend through substrate 405 and overlap and are electrically connected to an active region at a shared S/D terminal location, e.g., active region 432 at S/D terminal 220 between read transistors 412A and 412B (not shown in FIG. 4B). A back-side metal line 418 extends along the X axis in a first back-side metal layer and overlaps and is electrically connected to the through vias 430, four vias 440 overlap and are electrically connected to metal line 418, and a back-side metal line 436 extends along the Y axis in a second back-side metal layer and overlaps and is electrically connected to the vias 440. Through vias 430, back-side metal line 418, vias 440, and back-side metal line 436 are thereby configured as electrical connection BLL through which each of the two instances of 2T OTP bit 206 is configured to receive a signal BL[0], an instance of bit line signal BL, in OTP programming and read operations.

In some embodiments, back-side metal line 436 is electrically connected to one or more additional features (not shown) through which signal BL[0] is received. In some embodiments, signal BL[0] is received through back-side metal line 418 and the combined cross-sectional area of back-side metal line 436 and vias 440 acts to decrease the resistance of electrical connection BLL compared to embodiments that do not include back-side metal line 436 and vias 440. In some embodiments, back-side metal line 418 has a width W1 that is three times (3X) to four times (4X) greater than bit line widths in approaches including front-side bit lines.

FIG. 5 is a layout diagram of 2T OTP bit cell back side 503, in accordance with some embodiments. In some embodiments, back side 503 is configured to be combined with front side 401 (FIG. 4A) or front side 601 (FIG. 6) to create a 2T OTP bit cell including 2T OTP bits 206.

Back side 503 includes substrate 405, through vias 530, a back-side metal line 518, vias 540, and a back-side metal line 536 which correspond to and are electrically configured in the manner discussed above with respect to substrate 405, through vias 430, back-side metal line 418, vias 440, and back-side metal line 436 of back side 403 depicted in FIG. 4B. Compared to back side 403, back-side metal line 518 extends along the Y axis instead of the X axis, and back side 503 includes six through vias 530 instead of two, and eight vias 540 instead of four. In some embodiments, two or more of through vias 530 are electrically connected to an MD region (not shown) corresponding to S/D terminal 220 at locations outside of the corresponding active area.

Back side 503 also includes vias 534 overlapping and electrically connected to back-side metal line 536, and a back-side metal line 544 extending along the X axis in a third back-side metal layer and overlapping and electrically connected to vias 534. Through vias 530, back-side metal line 518, vias 540, back-side metal line 536, vias 534, and back-side metal line 544 are thereby configured as electrical connection BLL through which each of the two instances of 2T OTP bit 206 is configured to receive signal BL[0] in OTP programming and read operations.

In some embodiments, back-side metal line 544 has a width W2 that is 3× to 4× greater than bit line widths in approaches including front-side bit lines.

FIG. 6 is a layout diagram of 2T OTP bit cell front side 601, in accordance with some embodiments. In some embodiments, front side 601 is configured to be combined with back side 403 (FIG. 4B) or back side 503 (FIG. 5) to create a 2T OTP bit cell including 2T OTP bits 206.

Front side 601 includes substrate 405, active area 432, and gates 414 configured as program transistors 410A and 410B and read transistors 412A and 412B, as discussed above with respect to FIG. 4A. Front side 601 also includes vias 642, front-side metal lines 626, vias 628, and front-side metal lines 6P0, 6R0, 6R1, and 6P1 which correspond to and are electrically configured in the manner discussed above with respect to vias 442, front-side metal lines 426, vias 428, and front-side metal lines 4P0, 4R0, 4R1, and 4P1 of front side 401 depicted in FIG. 4A. Compared to front side 401, front-side metal lines 626 extend along the Y axis instead of the X axis, front-side metal lines 6R0 and 6R1 are between front-side metal lines 6P0 and 6P1 instead of front-side metal lines 4P0 and 4P1 being between front-side metal lines 4R0 and 4R1, and front side 601 includes two vias 642 per transistor instead of one, and five vias 628 per transistor instead of two.

Front side 601 is thereby configured to include 2T OTP bits 606A and 606B, each of which corresponds to 2T OTP bit 206. The vias 642 electrically connected to program transistor 410A, corresponding metal line 626 and vias 628, and metal line 6P0 are thereby configured as an instance of electrical connection WLPL configured to receive signal WLP[0]; the vias 642 electrically connected to read transistor 412A, corresponding metal line 626 and vias 628, and metal line 6R0 are thereby configured as an instance of electrical connection WLRL configured to receive signal WLR[0]; the vias 642 electrically connected to read transistor 412B, corresponding metal line 626 and vias 628, and metal line 6R1 are thereby configured as an instance of electrical connection WLRL configured to receive signal WLR[1]; and the vias 642 electrically connected to program transistor 410B, corresponding metal line 626 and vias 628, and metal line 6P1 are thereby configured as an instance of electrical connection WLPL configured to receive signal WLP[1].

In some embodiments, during OTP bit cell programming and reading operations, signals WLP[0] and WLR[0] are received at gates 414 of 2T OTP bit 606A, signals WLP[1] and WLR[1] are received at gates 414 of 2T OTP bit 606B, and bit line signal BL[0] is received at S/D terminal 220 (not labeled) through electrical connection BLL configured based on a back side, e.g., back side 403 or 503.

FIG. 7A is a layout diagram of a 2T OTP bit cell front side 701, in accordance with some embodiments. In some embodiments, front side 701 is configured to be combined with a back side 703 (FIG. 7B) or a back side 903 (FIG. 9) to create a 2T OTP bit cell including 2T OTP bits 206.

Front side 701 includes substrate 405, active area 432, and gates 414 configured as program transistors 410A and 410B and read transistors 412A and 412B, as discussed above with respect to FIG. 4A. A 2T OTP bit 706A includes program transistor 410A and read transistor 412A, and a 2T OTP bit 706B includes program transistor 410B and read transistor 412B. 2T OTP bits 706A and 706B include electrical connections WLPL and WLRL configured based on a back side, e.g., back side 703 or 903, and are thereby configured to receive signals WLP[0], WLR[0], WLR[1], and WLP[1].

Front side 701 also includes two vias 742 overlapping and electrically connected to active area 432 at S/D terminal 220, a metal line 716 extending along the X axis in the first front-side metal layer and overlapping and electrically connected to vias 742, four vias 728 overlapping and electrically connected to metal line 716, and a metal line 718 extending along the Y axis in the second front-side metal layer and overlapping and electrically connected to vias 728. Vias 742, front-side metal line 716, vias 728, and front-side metal line 718 are thereby configured as electrical connection BLL through which each of the two instances of 2T OTP bit 206 is configured to receive signal BL[0].

In some embodiments, during OTP bit cell programming and reading operations, signals WLP[0] and WLR[0] are received at gates 414 of 2T OTP bit 706A, signals WLP[1] and WLR[1] are received at gates 414 of 2T OTP bit 706B, and bit line signal BL[0] is received at S/D terminal 220 (not labeled) through electrical connection BLL.

The combined cross-sectional area of front-side metal line 718 and vias 728 acts to decrease the resistance of electrical connection BLL compared to embodiments that do not include front-side metal line 718 and vias 728.

FIG. 7B is a layout diagram of a 2T OTP bit cell back side 703, in accordance with some embodiments. In some embodiments, back side 703 is configured to be combined with front side 701 (FIG. 7A) or a front side 801 (FIG. 8) to create a 2T OTP bit cell including 2T OTP bits 206.

Back side 703 includes substrate 405, four through vias 730 that extend through substrate 405 and overlap and are electrically connected to gate electrodes of gates 414 corresponding to each of program transistors 410A and 410B and read transistors 412A and 412B. Back side 703 also includes four back-side metal lines 726 extending along the X axis in the first back-side metal layer and overlapping and electrically connected to through vias 730, four pairs of vias 740 overlapping and electrically connected to corresponding back-side metal lines 726, and back-side metal lines 7R0, 7P0, 7P1, and 7R1 extending along the Y axis in the second back-side metal layer and overlapping and electrically connected to corresponding pairs of vias 740.

A through via 730, back-side metal line 726, pair of vias 740, and back-side metal line 7R0 are thereby configured as an instance of electrical connection WLRL configured to receive signal WLR[0]; a through via 730, back-side metal line 726, pair of vias 740, and back-side metal line 7P0 are thereby configured as an instance of electrical connection WLPL configured to receive signal WLP[0]; a through via 730, back-side metal line 726, pair of vias 740, and back-side metal line 7P1 are thereby configured as an instance of electrical connection WLPL configured to receive signal WLP[1]; and a through via 730, back-side metal line 726, pair of vias 740, and back-side metal line 7R1 are thereby configured as an instance of electrical connection WLRL configured to receive signal WLR[1].

In some embodiments, during OTP bit cell programming and reading operations, signals WLP[0] and WLR[0] are received at gates 414 of a corresponding 2T OTP bit, signals WLP[1] and WLR[1] are received at gates 414 of a corresponding 2T OTP bit, and bit line signal BL[0] is received at S/D terminal 220 (not labeled) through an electrical connection BLL configured based on the front side, e.g., front side 701 or 801.

FIG. 8 is a layout diagram of 2T OTP bit cell front side 801, in accordance with some embodiments. In some embodiments, front side 801 is configured to be combined with back side 703 (FIG. 7B) or a back side 903 (FIG. 9) to create a 2T OTP bit cell including 2T OTP bits 206.

Front side 801 includes substrate 405, active area 432, and gates 414 configured as program transistors 410A and 410B and read transistors 412A and 412B, as discussed above with respect to FIG. 4A. A 2T OTP bit 806A includes program transistor 410A and read transistor 412A, and a 2T OTP bit 806B includes program transistor 410B and read transistor 412B. 2T OTP bits 806A and 806B include electrical connections WLPL and WLRL configured based on a back side, e.g., back side 703 or 903, and are thereby configured to receive signals WLP[0], WLR[0], WLR[1], and WLP[1].

Front side 801 also includes six vias 842 overlapping and electrically connected to active area 432 at S/D terminal 220, a metal line 816 extending along the Y axis in the first front-side metal layer and overlapping and electrically connected to vias 842, eight vias 828 overlapping and electrically connected to metal line 816, a metal line 818 extending along the Y axis in the second front-side metal layer and overlapping and electrically connected to vias 828, four vias 846 overlapping and electrically connected to metal line 818, and a metal line 836 extending along the X axis in a third front-side metal layer and overlapping and electrically connected to vias 846. Vias 842, front-side metal line 816, vias 828, front-side metal line 818, vias 846, and metal line 836 are thereby configured as electrical connection BLL through which each of the two instances of 2T OTP bit 206 is configured to receive signal BL[0].

In some embodiments, during OTP bit cell programming and reading operations, signals WLP[0] and WLR[0] are received at gates 414 of 2T OTP bit 806A, signals WLP[1] and WLR[1] are received at gates 414 of 2T OTP bit 806B, and bit line signal BL[0] is received at S/D terminal 220 (not labeled) through electrical connection BLL.

In some embodiments, metal line 836 is wider than other approaches. As metal lines are moved to a back side, e.g., back side 703 (FIG. 7B) or 903 (FIG. 9), fewer metal lines populate front side 801 and thus metal line 836 is capable of being widened to reduce resistivity. The combined cross-sectional area of metal lines 836, 818, and 816, and the parallel configuration of vias 842, 828, and 846 also act to decrease resistivity.

FIG. 9 is layout diagram of a 2T OTP bit cell back side 903, in accordance with some embodiments. In some embodiments, back side 903 is configured to be combined with front side 701 (FIG. 7A) or front side 801 (FIG. 8) to create a 2T OTP bit cell including 2T OTP bits 206.

Back side 903 includes substrate 405, four pairs of through vias 930 that extend through substrate 405 and overlap and are electrically connected to gate electrodes of gates 414 corresponding to each of program transistors 410A and 410B and read transistors 412A and 412B. Back side 903 also includes four back-side metal lines 926 extending along the Y axis in the first back-side metal layer and overlapping and electrically connected to corresponding pairs of through vias 930, four sets of five vias 940 overlapping and electrically connected to corresponding back-side metal lines 926, and back-side metal lines 9P0, 9R0, 9R1, and 9P1 extending along the Y axis in the second back-side metal layer and overlapping and electrically connected to corresponding sets of vias 940.

A pair of through vias 930, back-side metal line 926, set of vias 940, and back-side metal line 9P0 are thereby configured as an instance of electrical connection WLPL configured to receive signal WLP[0]; a pair of through vias 930, back-side metal line 926, set of vias 940, and back-side metal line 9R0 are thereby configured as an instance of electrical connection WLRL configured to receive signal WLR[0]; a pair of through vias 930, back-side metal line 926, set of vias 940, and back-side metal line 9R1 are thereby configured as an instance of electrical connection WLRL configured to receive signal WLR[1]; and a pair of through vias 930, back-side metal line 926, set of vias 940, and back-side metal line 9P1 are thereby configured as an instance of electrical connection WLPL configured to receive signal WLP[1].

In some embodiments, during OTP bit cell programming and reading operations, signals WLP[0] and WLR[0] are received at gates 414 of a corresponding 2T OTP bit, signals WLP[1] and WLR[1] are received at gates 414 of a corresponding 2T OTP bit, and bit line signal BL[0] is received at S/D terminal 220 (not labeled) through an electrical connection BLL configured based on the front side, e.g., front side 701 or 801.

FIG. 10A is a layout diagram of a 3T OTP bit cell front side 1001, in accordance with some embodiments. In some embodiments, front side 1001 is configured to be combined with a back side 1003 (FIG. 10B) or a back side 1103 (FIG. 11) to create a 3T OTP bit cell including 3T OTP bits 306.

Front side 1001 includes 3T OTP bits 1006A, 1006B, 1006C, and 1006D, each of which corresponds to 3T OTP bit 306. Each of 3T OTP bits 1006A-1006D includes a program transistor 1010 and read transistors 1012 and 1024 corresponding to respective program transistor 310 and read transistors 312 and 322.

With respect to FIGS. 10A-15, for the purpose of clarity, only the features of the program transistor 1010 and read transistors 1012 and 1024 included in a single instance of a 3T OTP bit, e.g., 3T OTP bit 1006A, are labeled and described in detail below.

Front side 1001 includes substrate 405 including two instances of active region 432 and eight instances of gates 414 (representative instances labeled) configured as discussed above with respect to program transistors 410A and 410B and read transistors 412A and 412B depicted in FIG. 4A. Compared to front side 401 depicted in FIG. 4A, front side 1001 includes two additional instances of gate 414 that extend along the Y axis and intersect and overlie instances of active region 432 at locations corresponding to read transistors 1024. Gates 414 are shared by adjacent 3T OTP bits 1006A and 1006C and by adjacent 3T OTP bits 1006B and 1006D.

Each portion of each active region 432 (not labeled) between read transistors 1012 of 3T OTP bits 1006A and 1006B and between read transistors 1012 of 3T OTP bits 1006A and 1006B corresponds to S/D terminal 320. Each portion of each active region 432 (not labeled) between a pair of read transistors 1012 and 1024 corresponds to shared S/D terminal 328. Each portion of each active region 432 (not labeled) between a program transistor 1010 and a read transistor 1024 corresponds to shared S/D terminal 326. Each portion of each active region 432 (not labeled) between a program transistor 1010 and an adjacent dummy gate 414 corresponds to S/D terminal 316.

A via 1042 overlaps and is electrically connected to gate 414 of program transistor 1010; a metal line 1026 extends along the X axis in the first front-side metal layer and overlaps and is electrically connected to the via 1042; a via 1028 overlaps and is electrically connected to the metal line 1026; and a metal line 10P extends along the Y axis in the second front-side metal layer and overlaps and is electrically connected to the via 1028. The via 1042, metal line 1026, via 1028, and metal line 10P are thereby configured as an instance of electrical connection WLPL configured to receive signal WLP[0], for example.

A via 1042 overlaps and is electrically connected to gate 414 of read transistor 1012; a metal line 1026 extends along the X axis in the first front-side metal layer and overlaps and is electrically connected to the via 1042; a via 1028 overlaps and is electrically connected to the metal line 1026; and a metal line 10R extends along the Y axis in the second front-side metal layer and overlaps and is electrically connected to the via 1028. The via 1042, metal line 1026, via 1028, and metal line 10R are thereby configured as an instance of electrical connection WLRL configured to receive signal WLR[0], for example.

A via 1042 overlaps and is electrically connected to gate 414 of read transistor 1024; a metal line 1026 extends along the X axis in the first front-side metal layer and overlaps and is electrically connected to the via 1042; a via 1028 overlaps and is electrically connected to the metal line 1026; and a metal line 10B extends along the Y axis in the second front-side metal layer and overlaps and is electrically connected to the via 1028. The via 1042, metal line 1026, via 1028, and metal line 10B are thereby configured as an instance of electrical connection WLBL configured to receive signal WLB[0], for example, an instance of signal WLB.

In some embodiments, during OTP bit cell programming and reading operations, signals WLP[0], WLR[0], and WLB[0] are received at gates 414 of 3T OTP bits 1006A and 1006C, signals WLP[1], WLR[1], and WLB[1] are received at gates 414 of 3T OTP bits 1006B and 1006D, and an instance of bit line signal BL is received at a corresponding S/D terminal 320 through electrical connection BLL configured based on a back side, e.g., back side 1003 or 1103.

FIG. 10B is a layout diagram of a 3T OTP bit cell back side 1003, in accordance with some embodiments. In some embodiments, back side 1003 is configured to be combined with front side 1001 (FIG. 10A) or a front side 1201 (FIG. 12) to create a 3T OTP bit cell including 3T OTP bits 306.

For ease of description and to prevent repetition of already discussed material, FIGS. 10B, 11, 13B, and 15 are described with reference to a single bit line of a back side, e.g., an electrical connection configured to receive bit line signal BL[0].

Back side 1003 includes substrate 405, through vias 1030, a back-side metal line 1018, vias 1040, and a back-side metal line 1036 which correspond to and are electrically configured in the manner discussed above with respect to substrate 405, through vias 430, back-side metal line 418, vias 440, and back-side metal line 436 of back side 403 depicted in FIG. 4B. Compared to back side 403, back side 1003 includes three through vias 1030 instead of two.

Through vias 1030, back-side metal line 1018, vias 1040, and back-side metal line 1036 are thereby configured as electrical connection BLL through which each of two corresponding instances of 3T OTP bit 306 is configured to receive signal BL[0] in OTP programming and read operations.

In some embodiments, back-side metal line 1018 has a width W3 that is 3× to 4× greater than bit line widths in approaches including front-side bit lines.

FIG. 11 is a layout diagram of a 3T OTP bit cell back side 1103, in accordance with some embodiments. In some embodiments, back side 1103 is configured to be combined with front side 1001 (FIG. 10A) or a front side 1201 (FIG. 12) to create a 3T OTP bit cell including 3T OTP bits 306.

Back side 1103 includes substrate 405, through vias 1130, a back-side metal line 1118, vias 1140, and a back-side metal line 1136 which correspond to and are electrically configured in the manner discussed above with respect to substrate 405, through vias 1030, back-side metal line 1018, vias 1040, and back-side metal line 1036 of back side 1003 depicted in FIG. 10B. Compared to back side 1003, back-side metal line 1118 extends along the Y axis instead of the X axis, and back side 1103 includes six through vias 1130 instead of three, and eight vias 1140 instead of four. In some embodiments, two or more of through vias 1130 are electrically connected to an MD region (not shown) corresponding to S/D terminal 320 at locations outside of the corresponding active area.

Back side 1103 also includes vias 1134 overlapping and electrically connected to back-side metal line 1136, and a back-side metal line 1144 extending along the X axis in the third back-side metal layer and overlapping and electrically connected to vias 1134. Through vias 1130, back-side metal line 1118, vias 1140, back-side metal line 1136, vias 1134, and back-side metal line 1144 are thereby configured as electrical connection BLL through which each of two corresponding instances of 3T OTP bit 306 is configured to receive signal BL[0] in OTP programming and read operations.

In some embodiments, back-side metal line 1144 has a width W4 that is 3× to 4× greater than bit line widths in approaches including front-side bit lines.

FIG. 12 is a layout diagram of a 3T OTP bit cell front side 1201, in accordance with some embodiments. In some embodiments, front side 1201 is configured to be combined with back side 1003 (FIG. 10B) or back side 1103 (FIG. 11) to create a 3T OTP bit cell including 3T OTP bits 306.

Front side 1201 includes substrate 405, active area 432, and gates 414 configured as program transistors 1010 and read transistors 1012 and 1024, as discussed above with respect to FIG. 10A. Front side 1201 also includes vias 1242, front-side metal lines 1226, vias 1228, and front-side metal lines 12P, 12R, and 12B which correspond to and are electrically configured in the manner discussed above with respect to vias 1042, front-side metal lines 1026, vias 1028, and front-side metal lines 10P, 10R, and 10B of front side 1001 depicted in FIG. 10A. Compared to front side 1001, front-side metal lines 1226 extend along the Y axis instead of the X axis, front-side metal line 12B is between front-side metal lines 12P and 12R instead of front-side metal line 10P being between front-side metal lines 10B and 10R, and front side 1201 includes two vias 1242 per two transistors instead of one, and eleven vias 1228 per two transistors instead of one.

Front side 1201 is thereby configured to include 3T OTP bits 1206A, 1206B, 1206C, and 1206D, each of which corresponds to 3T OTP bit 306. The vias 1242 electrically connected to program transistor 1010, corresponding metal line 1026 and vias 1028, and metal line 10P are thereby configured as an instance of electrical connection WLPL configured to receive signal WLP[0], for example. The vias 1242 electrically connected to read transistor 1012, corresponding metal line 1026 and vias 1028, and metal line 12R are thereby configured as an instance of electrical connection WLRL configured to receive signal WLR[0], for example. The vias 1242 electrically connected to read transistor 1024, corresponding metal line 1026 and vias 1028, and metal line 12B are thereby configured as an instance of electrical connection WLBL configured to receive signal WLB[0], for example.

In some embodiments, during OTP bit cell programming and reading operations, signals WLP[0], WLR[0], and WLB[0] are received at gates 414 of 3T OTP bits 1206A and 1206C, signals WLP[1], WLR[1], and WLB[1] are received at gates 414 of 3T OTP bits 1206B and 1206D, and an instance of bit line signal BL is received at a corresponding S/D terminal 320 through electrical connection BLL configured based on a back side, e.g., back side 1003 or 1103.

FIG. 13A is a layout diagram a 3T OTP bit cell front side 1301, in accordance with some embodiments. In some embodiments, front side 1301 is configured to be combined with a back side 1303 (FIG. 13B) or a back side 1503 (FIG. 15) to create a 3T OTP bit cell including 3T OTP bits 306.

Front side 1301 includes substrate 405, active area 432, and gates 414 configured as program transistors 1010 and read transistors 1012 and 1024, as discussed above with respect to FIG. 10A. Each of 3T OTP bits 1306A, 1306B, 1306C, and 1306D includes instances of a program transistor 1010 and read transistors 1012 and 1024. 3T OTP bits 1306A, 1306B, 1306C, and 1306D include electrical connections WLPL, WLRL, and WLBL configured based on a back side, e.g., back side 1303 or 1503, and are thereby configured to receive signals WLP[0], WLB[0], WLR[0], WLR[1], WLB[1], and WLP[1].

Front side 1301 also includes, for each active area 432, three vias 1342 overlapping and electrically connected to the active area 432 at S/D terminal 320, a metal line 1316 extending along the X axis in the first front-side metal layer and overlapping and electrically connected to vias 1342, four vias 1328 overlapping and electrically connected to metal line 1316, and a metal line 1318 extending along the Y axis in the second front-side metal layer and overlapping and electrically connected to vias 1328. Vias 1342, front-side metal line 1316, vias 1328, and front-side metal line 1318 are thereby configured as electrical connection BLL through which each of two corresponding instances of 3T OTP bit 306 is configured to receive signal BL[0], for example.

In some embodiments, during OTP bit cell programming and reading operations, signals WLP[0], WLR[0], and WLB[0] are received at gates 414 of 3T OTP bits 1306A and 1306C, signals WLP[1], WLR[1], and WLB[1] are received at gates 414 of 3T OTP bits 1306B and 1306D, and bit line signal BL[0] or BL[1] is received at a corresponding S/D terminal 320 through electrical connection BLL.

The combined cross-sectional area of front-side metal line 1318 and vias 1328 acts to decrease the resistance of electrical connection BLL compared to embodiments that do not include front-side metal line 1318 and vias 1328.

FIG. 13B is a layout diagram of 3T OTP bit cell back side 1303, in accordance with some embodiments. In some embodiments, back side 1303 is configured to be combined with front side 1301 (FIG. 13A) or a front side 1401 (FIG. 14) to create a 3T OTP bit cell including 3T OTP bits 306.

3T OTP bit cell back side 1303 includes an upper back side 1303A and a lower back side 1303B. While upper back side 1303A and lower back side 1303B are not the same, there is some symmetry that will make the following description easily adaptable to the entire 3T OTP bit cell backside 1303. In some embodiments, upper back side 1303A is equivalent to lower back side 1303B rotated 180 degrees in the X-Y plane.

Back side 1303 includes substrate 405, six through vias 1330 that extend through substrate 405 and overlap and are electrically connected to gate electrodes of gates 414 corresponding to each of program transistors 1010 and read transistors 1012 and 1024. Back side 1303 also includes six back-side metal lines 1326 extending along the X axis in the first back-side metal layer and overlapping and electrically connected to through vias 1330, six vias 1340 overlapping and electrically connected to corresponding back-side metal lines 1326, and back-side metal lines 13B, 13P, and 13R extending along the Y axis in the second back-side metal layer and overlapping and electrically connected to corresponding vias 1340.

A through via 1330, back-side metal line 1326, via 1340, and back-side metal line 13B are thereby configured as an instance of electrical connection WLBL configured to receive signal WLB[0], for example. A through via 1330, back-side metal line 1326, via 1340, and back-side metal line 13P are thereby configured as an instance of electrical connection WLPL configured to receive signal WLP[0], for example. A through via 1330, back-side metal line 1326, via 1340, and back-side metal line 13R are thereby configured as an instance of electrical connection WLRL configured to receive signal WLR[0], for example.

In some embodiments, during OTP bit cell programming and reading operations, signals WLB[0], WLP[0], and WLR[0] are received at gates 414 of a corresponding 3T OTP bit, signals WLB[1], WLP[1], and WLR[1] are received at gates 414 of a corresponding 3T OTP bit, and bit line signal BL[0], for example, is received at S/D terminal 320 (not labeled) through an electrical connection BLL configured based on the front side, e.g., front side 1301 or 1401.

FIG. 14 is a layout diagram of a 3T OTP front side 1401, in accordance with some embodiments. In some embodiments, front side 1401 is configured to be combined with back side 1303 (FIG. 13B) or back side 1503 (FIG. 15) to create a 3T OTP bit cell including 3T OTP bits 306.

Front side 1401 includes substrate 405, active area 432, and gates 414 configured as program transistor 1010 and read transistors 1012 and 1024, as discussed above with respect to FIG. 10A. Each of 3T OTP bits 1306A, 1306B, 1306C, and 1306D includes a program transistor 1010 and read transistors 1012 and 1024 and electrical connections WLPL, WLBL, and WLRL configured based on a back side, e.g., back side 1303 or 1503, and are thereby configured to receive signals WLP[0], WLB[0], WLR[0], WLR[1], WLB[1], and WLP[1].

Front side 1401 also includes, for each active area 432, six vias 1442 overlapping and electrically connected to the active area 432 at S/D terminal 320, a metal line 1416 extending along the Y axis in the first front-side metal layer and overlapping and electrically connected to vias 1442, eight vias 1428 overlapping and electrically connected to metal line 1416, a metal line 1418 extending along the Y axis in the second front-side metal layer and overlapping and electrically connected to vias 1428, four vias 1446 overlapping and electrically connected to metal line 1418, and a metal line 1436 extending along the X axis in the third front-side metal layer and overlapping and electrically connected to vias 1446. Vias 1442, front-side metal line 1416, vias 1428, front-side metal line 1418, vias 1446, and metal line 1436 are thereby configured as electrical connection BLL through which each of two corresponding instances of 3T OTP bit 306 is configured to receive signal BL[0], for example.

In some embodiments, during OTP bit cell programming and reading operations, signals WLP[0], WLB[0], and WLR [0] are received at gates 414 of 3T OTP bits 1406A and 1406C, signals WLP[1], WLB[1], and WLR[1] are received at gates 414 of 3T OTP bits 1406B and 1406D, and bit line signal BL[0], for example, is received at S/D terminal 320 (not labeled) through electrical connection BLL.

In some embodiments, metal line 1436 is wider than other approaches. As metal lines are moved to a back side, e.g., back side 1303 (FIG. 13B) or 1503 (FIG. 15), fewer metal lines populate front side 1401 and thus metal line 1436 is capable of being widened to reduce resistivity. The combined cross-sectional area of metal lines 1436, 1418, and 1416, and the parallel configuration of vias 1442, 1428, and 1446 also act to decrease resistivity.

FIG. 15 is a layout diagram of a 3T OTP bit cell back side 1503, in accordance with some embodiments. In some embodiments, back side 1503 is configured to be combined with front side 1301 (FIG. 13A) or front side 1401 (FIG. 14) to create a 3T OTP bit cell including 3T OTP bits 306.

Back side 1503 includes substrate 405, six sets of three through vias 1530 that extend through substrate 405 and overlap and are electrically connected to gate electrodes of gates 414 corresponding to each of program transistor 1010 and read transistors 1012 and 1024. Back side 1503 also includes six back-side metal lines 1526 extending along the Y axis in the first back-side metal layer and overlapping and electrically connected to corresponding sets of through vias 1530, six sets of eleven vias 1540 overlapping and electrically connected to corresponding back-side metal lines 1526, and back-side metal lines 15P, 15B, and 15R extending along the Y axis in the second back-side metal layer and overlapping and electrically connected to corresponding sets of vias 1540.

A set of through vias 1530, back-side metal line 1526, set of vias 1540, and back-side metal line 15P are thereby configured as an instance of electrical connection WLPL configured to receive signal WLP[0], for example. A set of through vias 1530, back-side metal line 1526, set of vias 1540, and back-side metal line 15B are thereby configured as an instance of electrical connection WLBL configured to receive signal WLB[0], for example. A pair of through vias 1530, back-side metal line 1526, set of vias 1540, and back-side metal line 15R are thereby configured as an instance of electrical connection WLRL configured to receive signal WLR[0], for example.

In some embodiments, during OTP bit cell programming and reading operations, signals WLB[0], WLP[0], and WLR [0] are received at gates 414 of a corresponding 3T OTP bit, signals WLB[1], WLP[1], and WLR[1] are received at gates 414 of a corresponding 3T OTP bit, and bit line signal BL[0], for example, is received at S/D terminal 320 (not labeled) through an electrical connection BLL configured based on the front side, e.g., front side 1301 or 1401.

FIG. 16 is a layout diagram of a 2T OTP bit cell back side 1603, in accordance with some embodiments. Back side 1603 is configured to provide electrical connections capable of creating a 2T OTP bit cell including 2T OTP bits 206 free from a 2T OTP bit cell front side.

Back side 1603 includes substrate 405, a through via 1630 that extends through substrate 405 and overlaps and is electrically connected to active area 432, and four through vias 1630 that extend through substrate 405 and overlap and are electrically connected to gate electrodes of gates 414 corresponding to each of program transistors 410A and 410B and read transistors 412A and 412B. Back side 1603 also includes five back-side metal lines 1626 extending along the X axis in the first back-side metal layer and overlapping and electrically connected to corresponding through vias 1630, five vias 1640 overlapping and electrically connected to corresponding back-side metal lines 1626, and back-side metal lines 16R0, 16P0, 16P1, 16R1, and 1660 extending along the Y axis in the second back-side metal layer and overlapping and electrically connected to corresponding vias 1640.

A through via 1630, back-side metal line 1626, via 1640, and back-side metal line 16R0 are thereby configured as an instance of electrical connection WLRL configured to receive signal WLR[0]. A through via 1630, back-side metal line 1626, via 1640, and back-side metal line 16P0 are thereby configured as an instance of electrical connection WLPL configured to receive signal WLP[0]. A through via 1630, back-side metal line 1626, via 1640, and back-side metal line 16P1 are thereby configured as an instance of electrical connection WLPL configured to receive signal WLP[1]. A through via 1630, back-side metal line 1626, via 1640, and back-side metal line 16R1 are thereby configured as an instance of electrical connection WLRL configured to receive signal WLR[1]. A through via 1630, back-side metal line 1626, via 1640, and back-side metal line 1660 are thereby configured as an instance of electrical connection BLL configured to receive bit line signal BL.

In some embodiments, during OTP bit cell programming and reading operations, signals WLP[0] and WLR[0] are received at gates 414 of a corresponding 2T OTP bit 206 through corresponding electrical connections WLPL and WLRL, signals WLP[1] and WLR[1] are received at gates 414 of a corresponding 2T OTP bit 206 through corresponding electrical connections WLPL and WLRL, and bit line signal BL is received at S/D terminal 220 (not labeled) through electrical connection BLL.

In some embodiments, back-side metal line 1660 is electrically connected to one or more additional features (not shown) through which signal BL is received. In some embodiments, the combined cross-sectional area of multiple instances of back-side metal line 1660 and via 1640 acts to decrease the resistance of electrical connection BLL compared to embodiments that do not include back-side metal lines 1660 and vias 1640.

Because back side 1603 is configured to provide each of the electrical connections to the 2T OTP bits 206 free from a 2T OTP bit cell front side, fewer conductive metal line(s) populate a front side such that front-side metal lines are capable being widened to reduce resistivity.

FIG. 17 is a layout diagram of a 3T OTP bit cell backside 1703, in accordance with some embodiments. Back side 1703 is configured to provide electrical connections capable of creating a 3T OTP bit cell including 3T OTP bits 306 free from a 3T OTP bit cell front side.

Back side 1703 includes substrate 405, two through vias 1730 that extend through substrate 405 and overlap and are electrically connected to corresponding instances of active area 432, and six through vias 1730 that extend through substrate 405 and overlap and are electrically connected to gate electrodes of gates 414 corresponding to each of program transistors 1010 and read transistors 1012 and 1024. Back side 1703 also includes eight back-side metal lines 1726 extending along the X axis in the first back-side metal layer and overlapping and electrically connected to corresponding through vias 1730, eight vias 1740 overlapping and electrically connected to corresponding back-side metal lines 1726, and back-side metal lines 17B0, 17P0, 17R0, 17R1, 17P1, 17B1, and 1760 extending along the Y axis in the second back-side metal layer and overlapping and electrically connected to corresponding vias 1740.

A through via 1730, back-side metal line 1726, via 1740, and back-side metal line 17B0 are thereby configured as an instance of electrical connection WLBL configured to receive signal WLB[0]. A through via 1730, back-side metal line 1726, via 1740, and back-side metal line 17P0 are thereby configured as an instance of electrical connection WLPL configured to receive signal WLP[0]. A through via 1730, back-side metal line 1726, via 1740, and back-side metal line 17R0 are thereby configured as an instance of electrical connection WLRL configured to receive signal WLR[0]. A through via 1730, back-side metal line 1726, via 1740, and back-side metal line 17R1 are thereby configured as an instance of electrical connection WLRL configured to receive signal WLR[1]. A through via 1730, back-side metal line 1726, via 1740, and back-side metal line 17P1 are thereby configured as an instance of electrical connection WLPL configured to receive signal WLP[1]. A through via 1730, back-side metal line 1726, via 1740, and back-side metal line 17B 1 are thereby configured as an instance of electrical connection WLBL configured to receive signal WLB[1]. Each combination of a through via 1730, back-side metal line 1726, via 1740, and back-side metal line 1760 is thereby configured as an instance of electrical connection BLL configured to receive bit line signal BL, e.g., bit line signal BL[0] or BL[1].

In some embodiments, during OTP bit cell programming and reading operations, signals WLP[0], WLB[0], and WLR[0] are received at gates 414 of a corresponding 3T OTP bit 306 through corresponding electrical connections WLPL, WLBL, and WLRL, signals WLP[1], WLB[1], and WLR[1] are received at gates 414 of a corresponding 3T OTP bit 306 through corresponding electrical connections WLPL, WLBL, and WLRL, and bit line signals BL[0] and BL[1] are received at corresponding S/D terminals 320 (not labeled) through corresponding electrical connections BLL.

In some embodiments, each of back-side metal line 1760 is electrically connected to one or more additional features (not shown) through which signal BL is received. In some embodiments, the combined cross-sectional area of multiple instances of back-side metal line 1760 and via 1740 acts to decrease the resistance of electrical connection BLL compared to embodiments that do not include back-side metal lines 1760 and vias 1740.

Because back side 1703 is configured to provide each of the electrical connections to the 3T OTP bits 306 free from a 3T OTP bit cell front side, fewer conductive metal line(s) populate a front side such that front-side metal lines are capable being widened to reduce resistivity.

FIGS. 18A and 18B are diagrams of an IC structure, in accordance with some embodiments. Each of FIGS. 18A and 18B is a non-limiting example of a cross-sectional diagram of a portion of an IC structure corresponding to a back side, and is based on a plane defined by a Z axis perpendicular to each of the X and Y axes and a direction in the X-Y plane, e.g., the X axis.

FIG. 18A is a non-limiting example of a portion of an IC structure corresponding to a back side, e.g., a back side 703, 903, 1303, 1503, 1603, or 1703, in which an electrical connection includes a through via overlapping and electrically connected to a gate 414, and FIG. 18B is a non-limiting example of a portion of an IC structure corresponding to a back side, e.g., a back side 403, 503, 1003, 1103, 1603, or 1703, in which an electrical connection includes a through via overlapping and electrically connected to an active area 432.

In addition to gate 414, FIG. 18A includes substrate 405; a through via 1830 extending through substrate 405 and overlapping and electrically connected to gate 414; a back-side metal line 1818 extending along the cross-sectional plane in the first back-side metal layer and overlapping and electrically connected to through via 1830; a via 1840 overlapping and electrically connected to back-side metal line 1818; a back-side metal line 1836 extending along the cross-sectional plane in the second back-side metal layer and overlapping and electrically connected to via 1840; a via 1834 overlapping and electrically connected to back-side metal line 1836; and a back-side metal line 1844 extending along the cross-sectional plane in the third back-side metal layer and overlapping and electrically connected to via 1834.

In the embodiment depicted in FIG. 18A, through via 1830 is configured to be electrically connected to gate 414 by being directly connected to a gate electrode (not shown) of gate 1414. In some embodiments, through via 1830 is otherwise configured so as to be electrically connected to gate 414, e.g., by including one or more conductive layers between through via 1830 and the gate electrode of gate 414.

FIG. 18B includes substrate 405, metal lines 1818, 1836, and 1844 and vias 1840 and 1834 configured as discussed above with respect to FIG. 18A. Instead of gate 414, FIG. 18B includes active area 432 and MD segment 18MD. In the embodiment depicted in FIG. 18B, through via 1830 extends through substrate 405 and active area 432, and overlaps and is electrically connected to MD segment 18MD.

In the embodiment depicted in FIG. 18B, through via 1830 is configured to be electrically connected to MD segment 18MD by being directly connected to MD segment 18MD. In some embodiments, through via 1830 is otherwise configured so as to be electrically connected to MD segment 18MD, e.g., by including one or more conductive layers between through via 1830 and MD segment 18MD. In some embodiments, through via 1830 is configured to be electrically connected to MD segment 18MD through some or all of active area 432.

In the embodiment depicted in FIG. 18B, through via 1830 is configured to be electrically connected to MD segment 18MD by extending through active area 432. In some embodiments, through via 1830 is configured to be electrically connected to MD segment 18MD by extending through a portion of substrate 405 outside of active area 432 such that MD segment 18MD is free from extending through active area 432.

With respect to FIGS. 4B, 5, 7B, 9, 10B, 11, 13B, and 15-17, through via 1830 represents instances of through vias electrically connected to gates 414 or active areas 432, back-side metal lines 1818, 1836, and 1844 represent metal lines in the first, second, and third back-side metal layers, respectively, via 1840 represents vias positioned between the first and second back-side metal layers, and via 1834 represents vias positioned between the second and third back-side metal layers.

In each of the embodiments discussed above with respect to FIGS. 4A-18B, at least one back-side metal line is included in one or more of electrical connections BLL, WLPL, WLRL, or WLBL of a 2T OTP bit 206 or a 3T OTP bit 306. By thereby distributing metal lines used for the electrical connections among the front and back sides, or entirely on the back side in some embodiments, the collective space available for the metal lines is increased such that the width of a given metal line is capable of being greater than in approaches in which only front-side metal lines are used for bit line and transistor gate electrical connections.

The relatively larger metal line widths on the front and/or back sides result in decreased parasitic voltage drops as the metal line resistance is decreased accordingly. By decreasing parasitic voltage drops during programming and read operations, memory cell applied voltages are closer to target values such that the likelihood of functional failure of a given bit cell is decreased compared to other such approaches. This benefit allows bit cell size to remain small while providing adequate spacing between metal lines so as to support the relatively large voltage requirements of the programming operations.

In some embodiments, the increased metal line widths compared to other approaches enables overall electrical connection resistance to be further decreased by increasing the number of vias used to connect the metal lines of adjacent metal layers, e.g., vias 428 depicted in FIG. 4A and/or vias 440 depicted in FIG. 4B.

FIG. 19 is a flowchart of method 1900 of manufacturing an OTP bit, in accordance with some embodiments.

Method 1900 is operable to form an IC device, e.g., 2T OTP bit 206 or 3T OTP bit 306 based on the corresponding structures discussed above with respect to FIGS. 2-18B. In some embodiments, method 1900 is usable by an IC manufacturing system as part of an IC manufacturing flow, e.g., IC manufacturing system 2200 discussed below with respect to FIG. 22.

The sequence in which the operations of method 1900 are depicted in FIG. 19 is for illustration only; the operations of method 1900 are capable of being executed simultaneously and/or in sequences that differ from that depicted in FIG. 19. In some embodiments, operations in addition to those depicted in FIG. 19 are performed before, between, during, and/or after the operations depicted in FIG. 19.

In some embodiments, one or more operations of method 1900 are executed using various fabrication tools, e.g., one or more of a wafer stepper, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed below.

At operation 1910, a program transistor and a first read transistor including respective first and second portions of an active area are fabricated on a front side of a substrate. In some embodiments, fabricating the program transistor includes fabricating program transistor 210 or 310 discussed above with respect to FIGS. 2 and 3. In some embodiments, fabricating the first read transistor includes fabricating read transistor 212 or 312 discussed above with respect to FIGS. 2 and 3.

In some embodiments, fabricating the program transistor and the first read transistor including respective first and second portions of an active area includes fabricating program transistor 410A or 410B and read transistor 412A or 412B including respective first and second portions of active area 432 discussed above with respect to FIGS. 4A-9 and 16. In some embodiments, fabricating the program transistor and the first read transistor including respective first and second portions of an active area includes fabricating program transistor 1010 and read transistor 1012 including respective first and second portions of active area 432 discussed above with respect to FIGS. 10A-15 and 17.

In some embodiments, fabricating the program transistor and the first read transistor includes fabricating a second read transistor including a third portion of the active area. In some embodiments, fabricating the second read transistor includes fabricating read transistor 322 discussed above with respect to FIG. 3. In some embodiments, fabricating the second read transistor including the third portion of the active area includes fabricating read transistor 1024 including a third portion of active area 432 discussed above with respect to FIGS. 10A-15 and 17.

At operation 1920, a via is constructed from a back side of the substrate to one of a gate of the program transistor, a gate of the first read transistor, or the active area. In some embodiments, the via is a first via, and constructing the via includes constructing the first via from the back side of the substrate to the gate of the program transistor and constructing a second via from the back side of the substrate to the gate of the first read transistor. In some embodiments, constructing the first via from the back side of the substrate to the gate of the program transistor and constructing the second via from the back side of the substrate to the gate of the first read transistor includes constructing a via 730, 930, 1330, 1530, 1630, 1730, or 1830 discussed above with respect to FIGS. 7B, 9, 13B, and 15-18A.

In some embodiments, constructing the via further comprises constructing a third via from the back side of the substrate to the gate of the second read transistor. In some embodiments, constructing the third via from the back side of the substrate to the gate of the second read transistor includes constructing a via 1330, 1530, 1730, or 1830 discussed above with respect to FIGS. 13B, 15, 17, and 18A.

In some embodiments, constructing the via includes constructing a via 430, 530, 1030, 1130, 1630, 1730, or 1830 from the back side of the substrate to active area 432 discussed above with respect to FIGS. 4B, 5, 10B, 11, 16, 17, and 18B.

In some embodiments, constructing the via comprises constructing the via from the back side of the substrate to an MD segment overlapping the active area, e.g., MD segment 18MD discussed above with respect to FIG. 18B.

At operation 1930, a metal line is constructed in a back-side metal layer, the metal line and the via thereby being included in an electrical connection to the one of the gate of the program transistor, the gate of the first read transistor, or the active area. In some embodiments, constructing the metal line in the back-side metal layer includes the metal line and the via thereby being included in an electrical connection to the gate of the second read transistor.

In some embodiments, constructing the metal line in the back-side metal layer includes constructing one or more of the back-side metal lines and vias discussed above with respect to FIGS. 4B, 5, 7B, 9, 10B, 11, 13B, and 15-18B.

In some embodiments, the back-side metal line and the via thereby being included in an electrical connection to the one of the gate of the program transistor, the gate of the first read transistor, the gate of the second transistor, or the active area includes the back-side metal line and the via being included in one of electrical connections WLPL, WLRL, WLBL, or BLL discussed above with respect to FIGS. 2-18B.

At operation 1940, in some embodiments, a metal line is constructed in a front-side metal layer, the front-side metal line thereby being included in an electrical connection to one of the gate of the program transistor, the gate of the first read transistor, the gate of the second read transistor, or the active area. The electrical connection to the one of the gate of the program transistor, the gate of the first read transistor, the gate of the second read transistor, or the active area is complementary to the electrical connection constructed in operation 1930.

In some embodiments, constructing the metal line in the front-side metal layer includes constructing one or more of the front-side metal lines and vias discussed above with respect to FIGS. 4A, 6, 7A, 8, 10A, 12, 13A, 14, 18A, and 18B.

In some embodiments, the front-side metal line and the via thereby being included in an electrical connection to the one of the gate of the program transistor, the gate of the first read transistor, the gate of the second transistor, or the active area includes the front-side metal line and the via being included in one of electrical connections WLPL, WLRL, WLBL, or BLL discussed above with respect to FIGS. 2-18B.

By executing some or all of the operations of method 1900, an OTP bit is manufactured including at least one back-side metal line in one or more of a bit line electrical connection or an electrical connection to a gate of the OTP bit transistors, thereby obtaining the benefits discussed above with respect to FIGS. 2-18B.

FIG. 20 is a flowchart of method 2000 of generating an IC layout diagram, in accordance with some embodiments.

In some embodiments, generating the IC layout diagram includes generating an IC layout diagram based on a combination of a front side and a back side as discussed above with respect to Tables 1 and 2.

In some embodiments, some or all of method 2000 is executed by a processor of a computer. In some embodiments, some or all of method 2000 is executed by a processor 2102 of EDA system 2100, discussed below with respect to FIG. 21.

Some or all of the operations of method 2000 are capable of being performed as part of a design procedure performed in a design house, e.g., a design house 2220 discussed below with respect to FIG. 22.

In some embodiments, the operations of method 2000 are performed in the order depicted in FIG. 20. In some embodiments, the operations of method 2000 are performed simultaneously and/or in an order other than the order depicted in FIG. 20. In some embodiments, one or more operations are performed before, between, during, and/or after performing one or more operations of method 2000.

At operation 2010, in some embodiments, an active region is overlapped with a plurality of gate regions, thereby defining a program transistor and a read transistor of an OTP bit. In some embodiments, overlapping the active region with the plurality of gate regions, thereby defining the program transistor and the read transistor of the OTP bit includes overlapping active region 432 with gates 414, thereby defining program transistor 410A or 410B and read transistor 412A or 412B discussed above with respect to FIGS. 4A-9 and 16. In some embodiments, overlapping the active region the plurality of gate regions, thereby defining the program transistor and the read transistor of the OTP bit includes overlapping active region 432 with gates 414, thereby defining program transistor 1010 and read transistor 1012 discussed above with respect to FIGS. 10A-15 and 17.

At operation 2020, a through via region is overlapped with one of the gate regions or the active region. In some embodiments, overlapping the through via with one of the gate regions or the active region includes overlapping a via 730, 930, 1330, 1530, 1630, 1730, or 1830 with a gate 414 discussed above with respect to FIGS. 7B, 9, 13B, and 15-18A.

In some embodiments, overlapping the through via with one of the gate regions or the active region includes overlapping a via 430, 530, 1030, 1130, 1630, 1730, or 1830 with active area 432 discussed above with respect to FIGS. 4B, 5, 10B, 11, 16, 17, and 18B. In some embodiments, overlapping the through via with one of the gate regions or the active region includes overlapping a via 430, 530, 1030, 1130, 1630, 1730, or 1830 with an MD segment, e.g., MD segment 18MD discussed above with respect to FIG. 18B.

At operation 2030, the through via region is overlapped with a metal region of a back-side metal layer. In some embodiments, overlapping the through via region with the metal region of the back-side layer includes overlapping the through via with one or more of the back-side metal and via regions discussed above with respect to FIGS. 4B, 5, 7B, 9, 10B, 11, 13B, and 15-18B.

At operation 2040, in some embodiments, one of the gate regions or active region is overlapped with a metal region of a front-side metal layer. Overlapping the one of the gate regions or active area is complementary to the overlapping performed in operation 2030.

In some embodiments, overlapping one of the gate regions or active region with the metal region of the front-side metal layer includes overlapping one of the gate regions or active region with one or more of the front-side metal and via regions discussed above with respect to FIGS. 4A, 6, 7A, 8, 10A, 12, 13A, 14, 18A, and 18B.

At operation 2050, in some embodiments, the IC layout diagram is generated and stored in a storage device. Generating the IC layout diagram is performed by a processor, e.g., processor 2102 of EDA system 2100 discussed below with respect to FIG. 21.

In various embodiments, storing the IC layout diagram in the storage device includes storing the IC layout diagram in a non-volatile, computer-readable memory or a cell library, e.g., a database, and/or includes storing the IC layout diagram over a network. In various embodiments, storing the IC layout diagram in the storage device includes storing the IC layout diagram in cell library 2107 and/or over network 2114 of EDA system 2100, discussed below with respect to FIG. 21.

At operation 2060, in some embodiments, one or more manufacturing operations are performed based on the IC layout diagram.

In some embodiments, performing the one or more manufacturing operations includes fabricating at least one of one or more semiconductor masks, or at least one component in a layer of a semiconductor IC based on the IC layout diagram. Fabricating one or more semiconductor masks or at least one component in a layer of a semiconductor IC is discussed below with respect to IC manufacturing system 2200 and FIG. 22.

In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 22.

By executing some or all of the operations of method 2000, an IC layout diagram is generated whereby an OTP bit includes at least one back-side metal line in one or more of a bit line electrical connection or an electrical connection to a gate of the OTP bit transistors, thereby obtaining the benefits discussed above with respect to FIGS. 2-18B.

Figure 21:
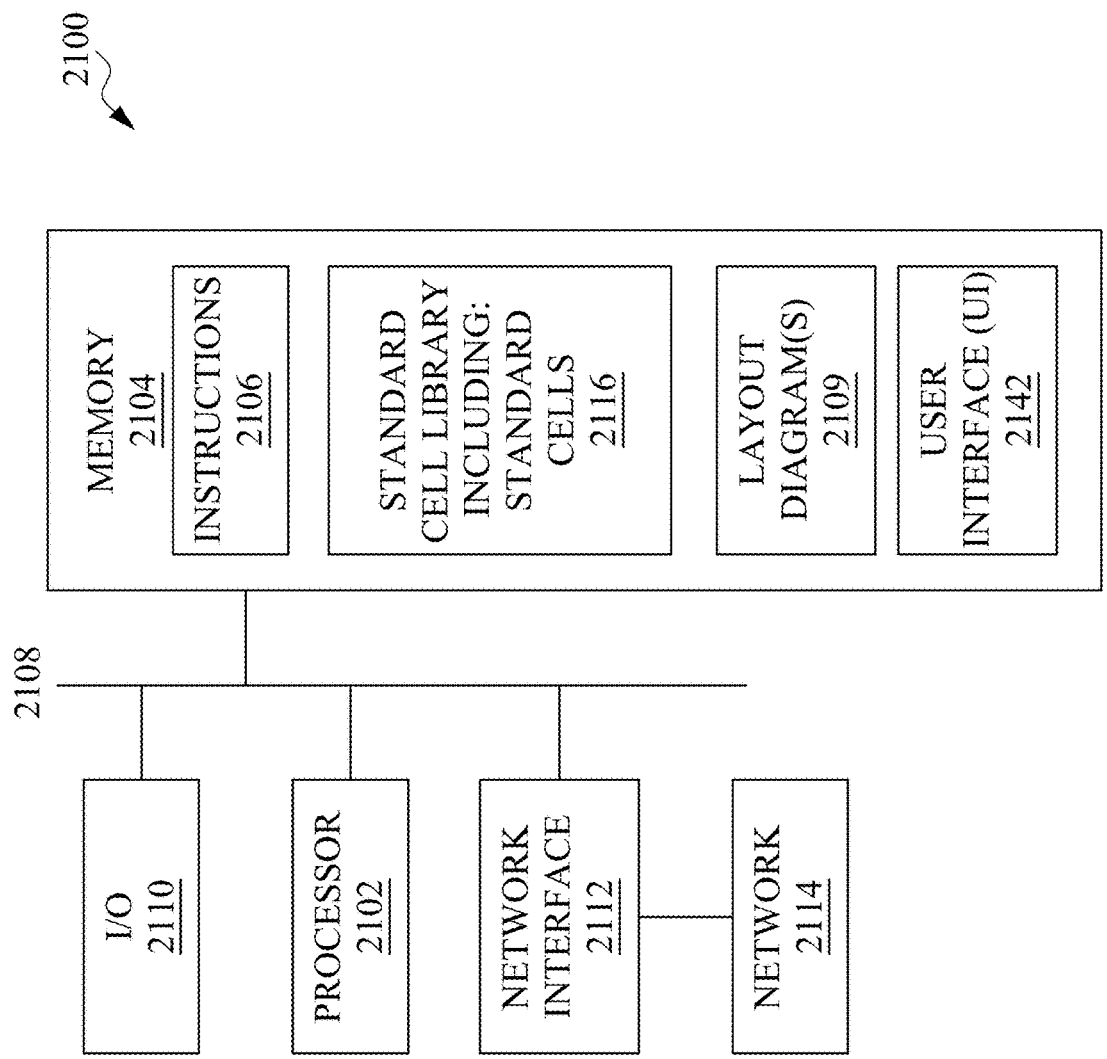
FIG. 21 is a block diagram of an electronic design automation (EDA) system, in accordance with some embodiments.

FIG. 21 is a block diagram of EDA system 2100, in accordance with some embodiments.

Additionally or alternatively, EDA system 2100 includes an APR system. In some embodiments, methods described herein of designing layout diagrams represent wire routing arrangements, in accordance with one or more embodiments, are implementable, for example, using EDA system 2100, in accordance with some embodiments.

In some embodiments, EDA system 2100 is a general purpose computing device including a hardware processor 2102 and a non-transitory, computer-readable storage medium 2104. Additionally or alternatively, storage medium 2104, amongst other things, is encoded with, i.e., stores, computer program code 2106, i.e., a set of executable instructions. In some embodiments, execution of computer program code 2106 by hardware processor 2102 represents (at least in part) an EDA tool which implements a portion or all of a method, e.g., method 2000, described herein in accordance with one or more embodiments (hereinafter, the noted processes and/or methods).

In some embodiments, processor 2102 is electrically coupled to computer-readable storage medium 2104 via a bus 2108. Additionally or alternatively, processor 2102 is also electrically coupled to an I/O interface 2110 by bus 2108. In some embodiments, a network interface 2112 is also electrically connected to processor 2102 via bus 2108. Additionally or alternatively, network interface 2112 is connected to a network 2114, so that processor 2102 and computer-readable storage medium 2104 are capable of connecting to external elements via network 2114. In some embodiments, processor 2102 is configured to execute computer program code 2106 encoded in computer-readable storage medium 2104 in order to cause EDA system 2100 to be usable for performing a portion or all of the noted processes and/or methods. In one or more embodiments, processor 2102 is a central processing unit (CPU), a multi-processor, a distributed processing system, an application specific integrated circuit (ASIC), and/or a suitable processing unit.

In one or more embodiments, computer-readable storage medium 2104 is an electronic, magnetic, optical, electromagnetic, infrared, and/or a semiconductor system (or apparatus or device). For example, computer-readable storage medium 2104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 2104 includes a compact disk-read only memory (CD-ROM), a compact disk-read/write (CD-R/W), and/or a digital video disc (DVD).

In one or more embodiments, storage medium 2104 stores computer program code 2106 configured to cause EDA system 2100 (where such execution represents (at least in part) the EDA tool) to be usable for performing a portion or all of the noted processes and/or methods. In one or more embodiments, storage medium 2104 also stores information which facilitates performing a portion or all of the noted processes and/or methods. In one or more embodiments, storage medium 2104 stores library 2107 of standard cells including such standard cells as disclosed herein. In one or more embodiments, storage medium 2104 stores one or more layout diagrams 2109 corresponding to one or more layout diagrams disclosed herein.

In some embodiments, EDA system 2100 includes I/O interface 2110. Additionally or alternatively, I/O interface 2110 is coupled to external circuitry. In one or more embodiments, I/O interface 2110 includes a keyboard, keypad, mouse, trackball, trackpad, touchscreen, and/or cursor direction keys for communicating information and commands to processor 2102.

In some embodiments, EDA system 2100 also includes network interface 2112 coupled to processor 2102. Additionally or alternatively, network interface 2112 allows EDA system 2100 to communicate with network 2114, to which one or more other computer systems are connected. In some embodiments, network interface 2112 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 2100.

In some embodiments, EDA system 2100 is configured to receive information through I/O interface 2110. Additionally or alternatively, the information received through I/O interface 2110 includes one or more of instructions, data, design rules, libraries of standard cells, and/or other parameters for processing by processor 2102. In some embodiments, the information is transferred to processor 2102 via bus 2108. Additionally or alternatively, EDA system 2100 is configured to receive information related to a UI through I/O interface 2110. In some embodiments, the information is stored in computer-readable medium 2104 as user interface (UI) 2142.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 2100. In some embodiments, a layout diagram which includes standard cells is generated using a tool such as VIRTUOSO® available from CADENCE DESIGN SYSTEMS, Inc., or another suitable layout diagram generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 22:
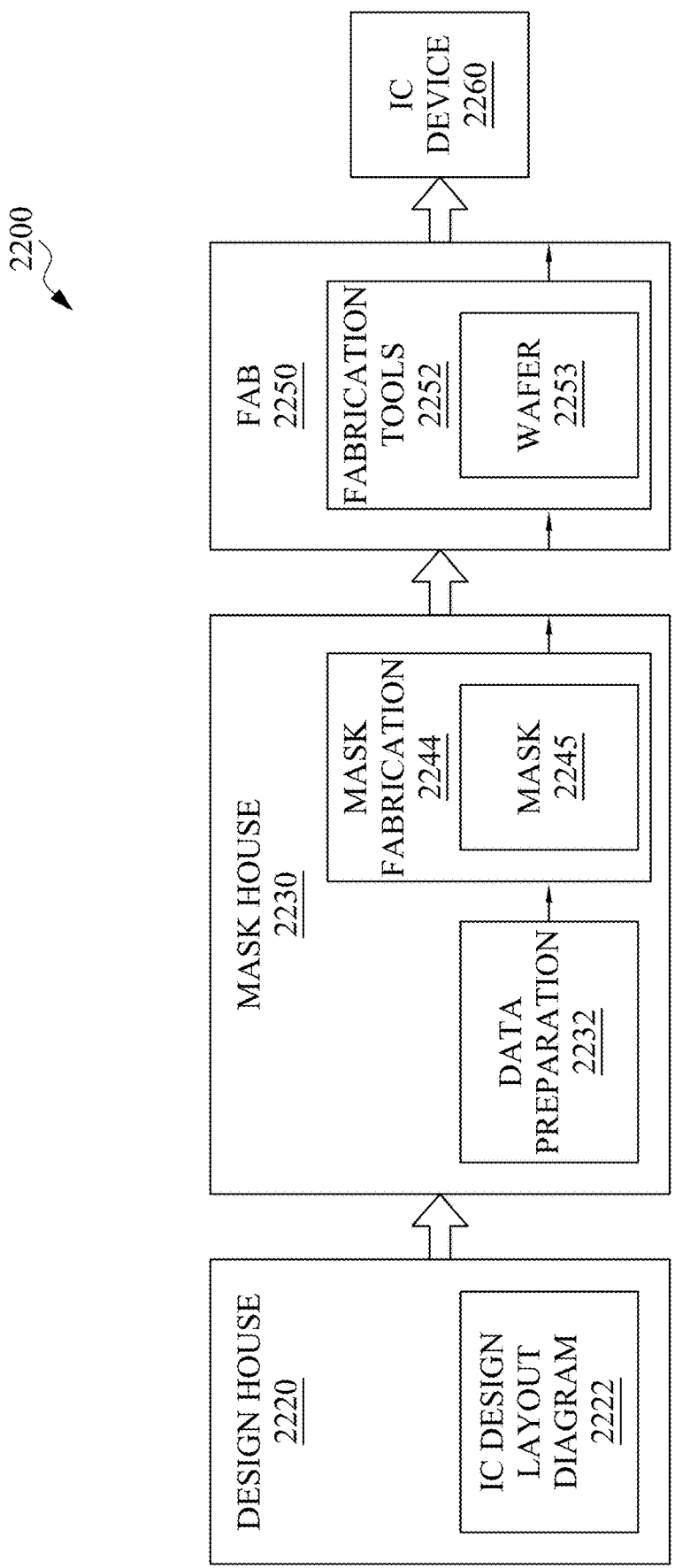
FIG. 22 is a block diagram of an IC manufacturing system, and an IC manufacturing flow associated therewith, in accordance with some embodiments.

FIG. 22 is a block diagram of an integrated circuit (IC) manufacturing system 2200, and an IC manufacturing flow associated therewith, in accordance with some embodiments.

In some embodiments, based on a layout diagram, at least one of (A) one or more semiconductor masks or (B) at least one component in a layer of a semiconductor integrated circuit is fabricated using manufacturing system 2200.

In some embodiments, in FIG. 22, IC manufacturing system 2200 includes entities, such as a design house 2220, a mask house 2230, and an IC manufacturer/fabricator ("fab") 2250, that interact with one another in the design, development, and manufacturing cycles and/or services related to manufacturing an IC device 2260. Additionally or alternatively, the entities in system 2200 are connected by a communications network. In some embodiments, the communications network is a single network. In some embodiments, the communications network is a variety of different networks, such as an intranet and the Internet. Additionally or alternatively, the communications network includes wired and/or wireless communication channels. In some embodiments, each entity interacts with one or more of the other entities and provides services to and/or receives services from one or more of the other entities. In some embodiments, two or more of design house 2220, mask house 2230, and IC fab 2250 is owned by a single larger company. In some embodiments, two or more of design house 2220, mask house 2230, and IC fab 2250 coexist in a common facility and use common resources.

In some embodiments, design house (or design team) 2220 generates an IC design layout diagram 2222. Additionally or alternatively, IC design layout diagram 2222 includes various geometrical patterns designed for an IC device 2260. In some embodiments, the geometrical patterns correspond to patterns of metal, oxide, or semiconductor layers that make up the various components of IC device 2260 to be fabricated. Additionally or alternatively, the various layers combine to form various IC features. For example, a portion of IC design layout diagram 2222 includes various IC features, such as an active region, gate terminal, source terminal and drain terminal, metal lines or vias of an interlayer interconnection, and openings for bonding pads, to be formed in a semiconductor substrate (such as a silicon wafer) and various material layers on the semiconductor substrate. In some embodiments, design house 2220 implements a proper design procedure to form IC design layout diagram 2222. Additionally or alternatively, the design procedure includes one or more of logic design, physical design or place and route. In some embodiments, IC design layout diagram 2222 is presented in one or more data files having information of the geometrical patterns. For example, IC design layout diagram 2222 is expressed in a GDSII file format or DFII file format.

In some embodiments, mask house 2230 includes mask data preparation 2232 and mask fabrication 2244. Additionally or alternatively, mask house 2230 uses IC design layout diagram 2222 to manufacture one or more masks 2245 to be used for fabricating the various layers of IC device 2260 according to IC design layout diagram 2222. In some embodiments, mask house 2230 performs mask data preparation 2232, where IC design layout diagram 2222 is translated into a representative data file ("RDF"). Additionally or alternatively, mask data preparation 2232 provides the RDF to mask fabrication 2244. In some embodiments, mask fabrication 2244 includes a mask writer. Additionally or alternatively, a mask writer converts the RDF to an image on a substrate, such as a mask (reticle) 2245 or a semiconductor wafer 2253. In some embodiments, the design layout diagram 2222 is manipulated by mask data preparation 2232 to comply with particular characteristics of the mask writer and/or requirements of IC fab 2250. Additionally or alternatively, in FIG. 22, mask data preparation 2232 and mask fabrication 2244 are illustrated as separate elements. In some embodiments, mask data preparation 2232 and mask fabrication 2244 are collectively referred to as mask data preparation.

In some embodiments, mask data preparation 2232 includes optical proximity correction (OPC) which uses lithography enhancement techniques to compensate for image errors, such as those that arise from diffraction, interference, other process effects and the like. Additionally or alternatively, OPC adjusts IC design layout diagram 2222. In some embodiments, mask data preparation 2232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 2232 includes a mask rule checker (MRC) that checks the IC design layout diagram 2222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 2222 to compensate for limitations during mask fabrication 2244, which undoes part of the modifications performed by OPC in order to meet mask creation rules.

In some embodiments, mask data preparation 2232 includes lithography process checking (LPC) that simulates processing that will be implemented by IC fab 2250 to fabricate IC device 2260. Additionally or alternatively, LPC simulates this processing based on IC design layout diagram 2222 to create a simulated manufactured device, such as IC device 2260. In some embodiments, the processing parameters in LPC simulation include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 2222.

In some embodiments, the above description of mask data preparation 2232 has been simplified for the purposes of clarity. In some embodiments, mask data preparation 2232 includes additional features such as a logic operation (LOP) to modify the IC design layout diagram 2222 according to manufacturing rules. Additionally, the processes applied to IC design layout diagram 2222 during mask data preparation 2232 are executed in a variety of different orders.

In some embodiments, after mask data preparation 2232 and during mask fabrication 2244, a mask 2245 or a group of masks 2245 are fabricated based on the modified IC design layout diagram 2222. In some embodiments, mask fabrication 2244 includes performing one or more lithographic exposures based on IC design layout diagram 2222. In some embodiments, an electron-beam (e-beam) or a mechanism of multiple e-beams is used to form a pattern on a mask (photomask or reticle) 2245 based on the modified IC design layout diagram 2222. Additionally or alternatively, mask 2245 is formed in various technologies. In some embodiments, mask 2245 is formed using binary technology. In some embodiments, a mask pattern includes opaque regions and transparent regions. Additionally or alternatively, a radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 2245 includes a transparent substrate (e.g., fused quartz) and an opaque material (e.g., chromium) coated in the opaque regions of the binary mask. In another example, mask 2245 is formed using a phase shift technology. In a phase shift mask (PSM) version of mask 2245, various features in the pattern formed on the phase shift mask are configured to have proper phase difference to enhance the resolution and imaging quality. In various examples, the phase shift mask is attenuated PSM or alternating PSM. Additionally or alternatively, the mask(s) generated by mask fabrication 2244 is used in a variety of processes. For example, such a mask(s) is used in an ion implantation process to form various doped regions in semiconductor wafer 2253, in an etching process to form various etching regions in semiconductor wafer 2253, and/or in other suitable processes.

In some embodiments, IC fab 2250 is an IC fabrication business that includes one or more manufacturing facilities for the fabrication of a variety of different IC products. In some embodiments, IC fab 2250 is a semiconductor foundry. For example, there is a manufacturing facility for the front end fabrication of a plurality of IC products (front-end-of-line (FEOL) fabrication), while a second manufacturing facility provides the back end fabrication for the interconnection and packaging of the IC products (back-end-of-line (BEOL) fabrication), and a third manufacturing facility provides other services for the foundry business.

In some embodiments, IC fab 2250 includes fabrication tools 2252 configured to execute various manufacturing operations on semiconductor wafer 2253 such that IC device 2260 is fabricated in accordance with the mask(s), e.g., mask 2245. In various embodiments, fabrication tools 2252 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

In some embodiments, IC fab 2250 uses mask(s) 2245 fabricated by mask house 2230 to fabricate IC device 2260. Additionally or alternatively, IC fab 2250 at least indirectly uses IC design layout diagram 2222 to fabricate IC device 2260. In some embodiments, semiconductor wafer 2253 is fabricated by IC fab 2250 using mask(s) 2245 to form IC device 2260. In some embodiments, the IC fabrication includes performing one or more lithographic exposures based at least indirectly on IC design layout diagram 2222. In some embodiments, semiconductor wafer 2253 includes a silicon substrate or other proper substrate having material layers formed thereon. Additionally or alternatively, semiconductor wafer 2253 further includes one or more of various doped regions, dielectric features, multilevel interconnects, and the like (formed at subsequent manufacturing steps).

In some embodiments, details regarding an integrated circuit (IC) manufacturing system (e.g., system 2200 of FIG. 22), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 2066640838, published Feb. 6, 2014, and U.S. Pat. No. 7,260,442, granted Aug. 21, 2007, the entireties of each of which are hereby incorporated by reference.

In some embodiments, an OTP bit cell includes a substrate including a front side and a back side, an active area on the front side, a first read transistor including a first gate and a first portion of the active area intersected by the first gate, a program transistor including a second gate and a second portion of the active area intersected by the second gate, a first electrical connection to the first gate, a second electrical connection to the second gate, and a third electrical connection to the active area. At least one of the first, second, or third electrical connections includes a metal line positioned on the back side.

In some embodiments, an IC includes a substrate having a front side and a back side, an OTP bit cell including a program transistor, the program transistor including a first portion of an active area that extends in a first direction, and a first gate that extends in a second direction and intersects the first portion of the active area, a first metal line on the front side of the substrate electrically connected to one of the active area or the first gate, and a second metal line on the back side of the substrate electrically connected to the other of the active area or the first gate.

In some embodiments, a method of manufacturing an OTP bit includes fabricating a program transistor and a first read transistor including respective first and second portions of an active area on a front side of a substrate, constructing a via from a back side of the substrate to one of a gate of the program transistor, a gate of the first read transistor, or the active area, and constructing a metal line in a back-side metal layer, the metal line and the via thereby being included in an electrical connection to the one of the gate of the program transistor, the gate of the first read transistor, or the active area.

The foregoing outline(s) features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A one-time programmable (OTP) bit cell comprising:
a substrate comprising a front side and a back side;
an active area on the front side;
a first read transistor comprising a first gate and a first portion of the active area intersected by the first gate;
a program transistor comprising a second gate and a second portion of the active area intersected by the second gate;
a first electrical connection to the first gate;
a second electrical connection to the second gate; and
a third electrical connection to the active area,
wherein at least one of the first, second, or third electrical connections comprises a metal line positioned on the back side.

2. The OTP bit cell of claim 1, wherein
the metal line is a first metal line positioned on the back side, the first electrical connection comprises the first metal line and a first through via between and electrically connected to the first gate and the first metal line, and the second electrical connection comprises a second metal line positioned on the back side and a second through via between and electrically connected to the second gate and the second metal line.

3. The OTP bit cell of claim 2, wherein each of the first and second metal lines is positioned in a first back-side metal layer, the first electrical connection comprises a third metal line positioned in a second back-side metal layer and a first plurality of vias between and electrically connected to the first and third metal lines, and the second electrical connection comprises a fourth metal line positioned in the second back-side metal layer and a second plurality of vias between and electrically connected to the second and fourth metal lines.

4. The OTP bit cell of claim 2, wherein the third electrical connection comprises:

a first front-side metal line positioned in a first front-side metal layer;

a second front-side metal line positioned in a second front-side metal layer; and a plurality of vias between and electrically connected to the first and second front-side metal lines.

5. The OTP bit cell of claim 2, further comprising:

a second read transistor comprising a third gate and a third portion of the active area intersected by the third gate; and a fourth electrical connection to the third gate, the fourth electrical connection comprising a third metal line positioned on the back side.

6. The OTP bit cell of claim 2, wherein the third electrical connection comprises a third metal line positioned on the back side.

7. The OTP bit cell of claim 1, wherein the third electrical connection comprises the metal line and a plurality of through vias between and electrically connected to the active area and the metal line.

8. The OTP bit cell of claim 7, wherein the metal line is a first metal line positioned on the back side, the first metal line is positioned in a first back-side metal layer, and the third electrical connection comprises a second metal line positioned in a second back-side metal layer and a plurality of vias between and electrically connected to the first and second metal lines.

9. The OTP bit cell of claim 7, wherein each of the first and second electrical connections comprises:

a first front-side metal line positioned in a first front-side metal layer;

a second front-side metal line positioned in a second front-side metal layer; and a plurality of vias between and electrically connected to the first and second front-side metal lines.

10. The OTP bit cell of claim 9, further comprising:

a second read transistor comprising a third gate and a third portion of the active area intersected by the third gate; and a fourth electrical connection to the third gate, wherein the fourth electrical connection comprises:

a third front-side metal line positioned in the first front-side metal layer;

a fourth front-side metal line positioned in the second front-side metal layer; and another plurality of vias between and electrically connected to the third and fourth front-side metal lines.

11. An integrated circuit (IC) comprising:

a substrate having a front side and a back side;

a one-time-programmable (OTP) bit cell comprising a program transistor, the program transistor comprising:

a first portion of an active area that extends in a first direction; and a first gate that extends in a second direction and intersects the first portion of the active area;

a first metal line on the front side of the substrate electrically connected to one of the active area or the first gate; and a second metal line on the back side of the substrate electrically connected to the other of the active area or the first gate.

12. The IC of claim 11, further comprising a via extending through the substrate between and electrically connected to the second metal line and the other of the active area or the first gate.

13. The IC of claim 12, wherein the via is one via of a plurality of vias between and electrically connected to the second metal line and the active area.

14. The IC of claim 12, wherein the via is between and electrically connected to the second metal line and the first gate and extends through the substrate at a location outside of the active area.

15. The IC of claim 11, wherein the OTP bit cell comprises a read transistor comprising a second portion of the active area and a second gate that intersects the second portion of the active area, and one of:

the first metal line is electrically connected to the first gate, and the IC comprises a third metal line on the front side electrically connected to the second gate, or the second metal line is electrically connected to the first gate, and the IC comprises a third metal line on the back side electrically connected to the second gate.

16. The IC of claim 11, wherein the OTP bit cell is one OTP bit cell of an OTP bit cell array, and each of the first and second metal lines is electrically connected to a corresponding program transistor gate or active area of another OTP bit cell of the OTP bit cell array.

17. A method of manufacturing a one-time-programmable (OTP) bit, the method comprising:

fabricating a program transistor and a first read transistor comprising respective first and second portions of an active area on a front side of a substrate;

constructing a via from a back side of the substrate to one of a gate of the program transistor, a gate of the first read transistor, or the active area; and constructing a metal line in a back-side metal layer, the metal line and the via thereby being included in an electrical connection to the one of the gate of the program transistor, the gate of the first read transistor, or the active area.

18. The method of claim 17, wherein the via is a first via, and the constructing the via comprises constructing the first via from the back side of the substrate to the gate of the program transistor and constructing a second via from the back side of the substrate to the gate of the first read transistor.

19. The method of claim 18, wherein
the fabricating the program transistor and the first read transistor comprises fabricating a second read transistor comprising a third portion of the active area, and
the constructing the via further comprises constructing a third via from the back side of the substrate to the gate of the second read transistor.

20. The method of claim 17, wherein the constructing the via comprises constructing the via from the back side of the substrate to a metal-like defined (MD) segment overlapping the active area.

* * * * *